US012765051B2

(12) United States Patent
Chung et al.

(10) Patent No.: US 12,765,051 B2
(45) Date of Patent: Oct. 13, 2026

(54) NFET AND PFET WITH DIFFERENT Fin NUMBERS IN FinFET BASED CFET

(71) Applicant: Taiwan Semiconductor Manufacturing Co., Ltd., Hsinchu (TW)

(72) Inventors: Cheng-Ting Chung, Hsinchu (TW); Jin Cai, Hsinchu (TW); Szuya Liao, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 724 days.

(21) Appl. No.: 18/302,948

(22) Filed: Apr. 19, 2023

(65) Prior Publication Data

US 2024/0282772 A1 Aug. 22, 2024

Related U.S. Application Data

(60) Provisional application No. 63/485,742, filed on Feb. 17, 2023.

(51) Int. Cl.

*H10D 84/85* (2025.01)
*H10D 84/01* (2025.01)
*H10D 84/03* (2025.01)
*H10D 88/00* (2025.01)

(52) U.S. Cl.

CPC ....... *H10D 84/856* (2025.01); *H10D 84/0188* (2025.01); *H10D 84/0193* (2025.01); *H10D 84/038* (2025.01); *H10D 84/853* (2025.01); *H10D 88/01* (2025.01)

(58) Field of Classification Search

CPC ..... H10D 86/215; H10D 88/00; H10D 86/011
See application file for complete search history.

(56) References Cited

U.S. PATENT DOCUMENTS

| | | | |
|---|---|---|---|
| 2015/0333156 A1 | 11/2015 | Cheng et al. | |
| 2018/0337188 A1 | 11/2018 | Yu et al. | |
| 2020/0328127 A1 | 10/2020 | Yamashita et al. | |
| 2020/0411433 A1* | 12/2020 | Lilak .................... | H10D 84/038 |
| 2022/0093766 A1 | 3/2022 | Chen et al. | |
| 2023/0307552 A1 | 9/2023 | Huang et al. | |
| 2024/0015985 A1 | 1/2024 | Young et al. | |

FOREIGN PATENT DOCUMENTS

| | | |
|---|---|---|
| TW | 201901753 A | 1/2019 |
| TW | 202145364 A | 12/2021 |
| TW | 202201564 A | 1/2022 |
| TW | 202205587 A | 2/2022 |

* cited by examiner

*Primary Examiner* — Fernando L Toledo
*Assistant Examiner* — Adam S Bowen
(74) *Attorney, Agent, or Firm* — Slater Matsil, LLP

(57) ABSTRACT

A method includes forming a complementary Field-Effect Transistor (CFET) including a first FinFET and a second FinFET. The processes for forming the first FinFET includes forming at least one semiconductor fin having a first total count, and forming a first gate stack on the at least one semiconductor fin. The second FinFET is vertically aligned to the first FinFET. The processes for forming the second FinFET includes forming a plurality of semiconductor fins, wherein the plurality of semiconductor fins have a second total count greater than the first total count, and forming a second gate stack on the plurality of semiconductor fins.

20 Claims, 45 Drawing Sheets

NFET AND PFET WITH DIFFERENT Fin NUMBERS IN FinFET BASED CFET

PRIORITY CLAIM AND CROSS-REFERENCE

This application claims the benefit of the following provisionally filed U.S. Patent application: Application No. 63/485,742, filed on Feb. 17, 2023, and entitled "N- and P-FET with Different Fin Numbers in FinFET Based CFET," which application is hereby incorporated herein by reference.

BACKGROUND

Semiconductor devices are used in a variety of electronic applications such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. As the minimum feature sizes are reduced, however, additional problems arise and should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 through FIGS. 19A, 19B, and 19C illustrate the cross-sectional views of intermediate stages in the monolithic formation of a Complementary FET (CFET) through bottom fin-cut in accordance with some embodiments.

FIGS. 20A-1 and 20B-1 illustrate the cross-sectional views of a CFET in accordance with some embodiments.

FIGS. 20A-2 and 20B-2 illustrate the cross-sectional views of a CFET in accordance with some embodiments.

FIG. 21 through FIGS. 35A, 35B, and 35C illustrate the cross-sectional views of intermediate stages in the monolithic formation of a CFET with top fin-cut in accordance with some embodiments.

FIGS. 36A, 36B, and 36C through 43A, 43B, and 43C illustrate the cross-sectional views of intermediate stages in the sequential formation of a CFET with bottom fin-cut in accordance with some embodiments.

DETAILED DESCRIPTION

Figure 1:
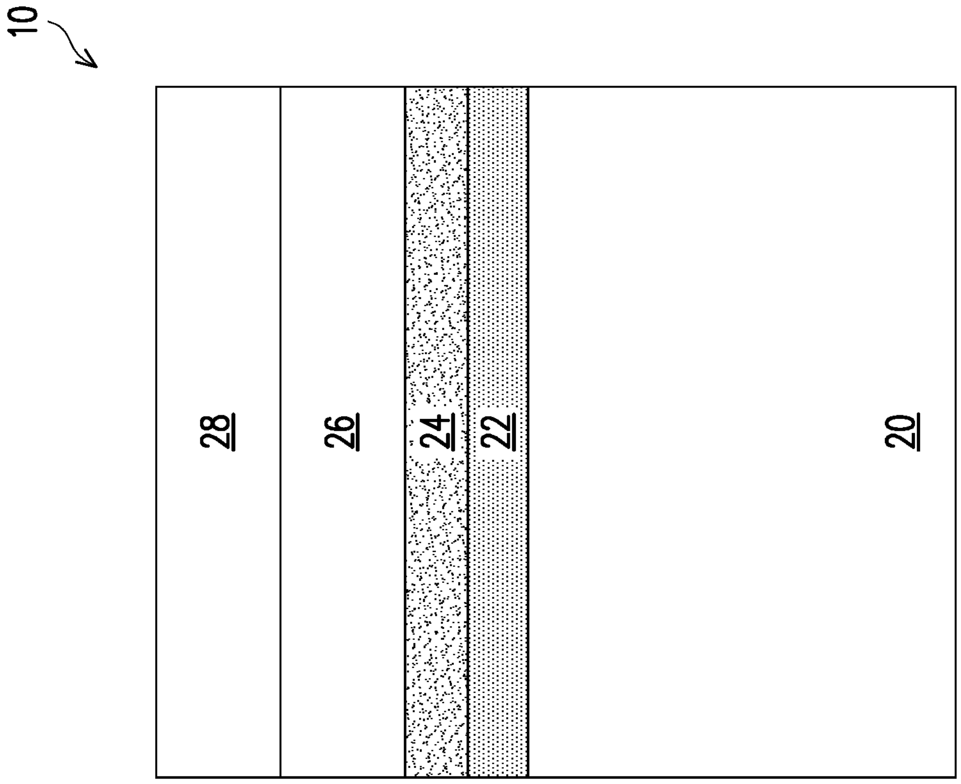

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) based Complementary FET (CFET) with the top fin number different from bottom fin number and the method of forming the same are provided. In accordance with some embodiments, one of the fins in either the top FinFET or the bottom FinFET is cut, so that its fin number is smaller than the fin number in the other FinFET. This type of CFET may meet the requirement of some of circuits. For example, high-current Static Random-Access Memory (SRAM) cells may adopt such a structure to improve write margin. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 44:
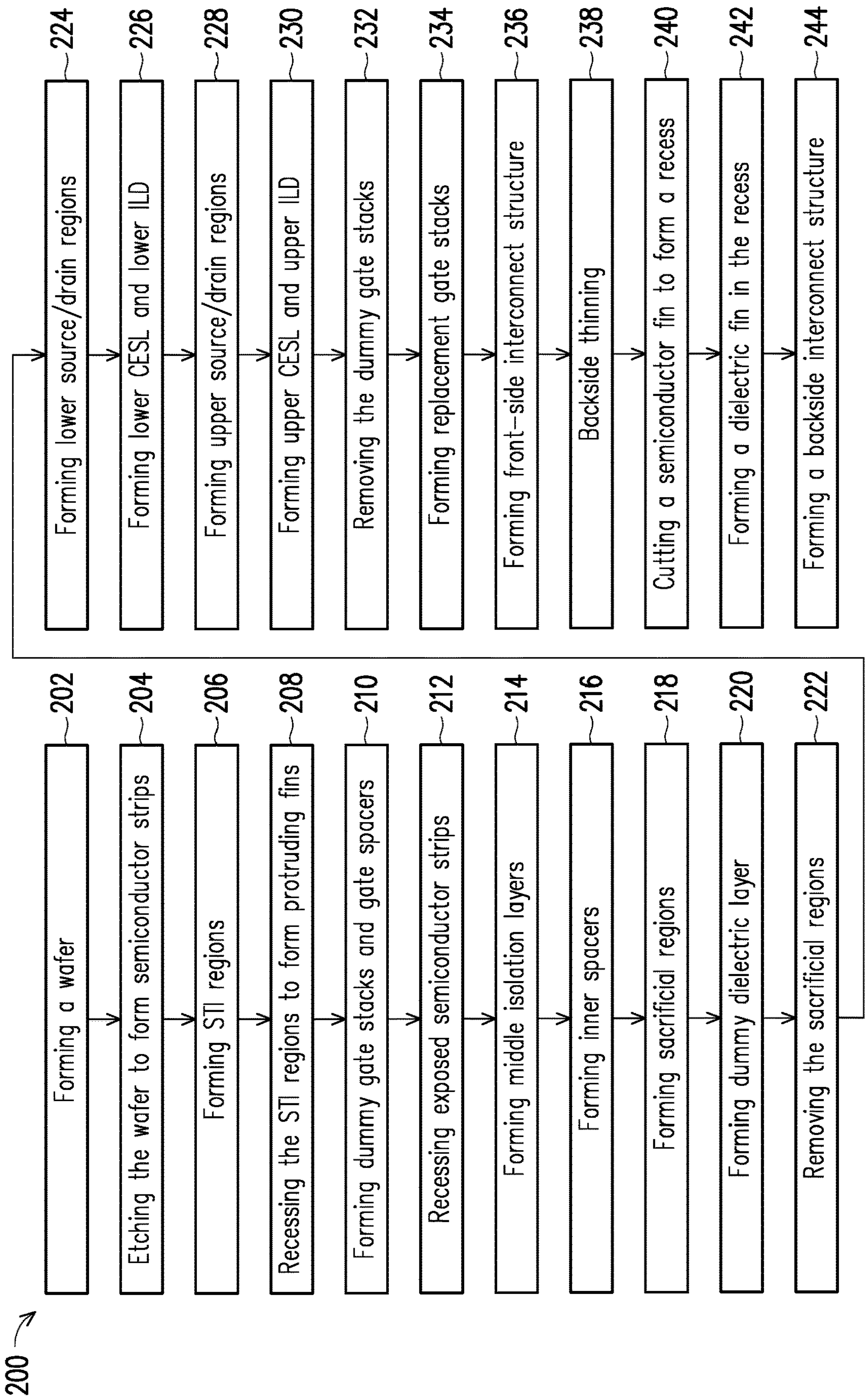
FIG. 44 illustrates a process flow for forming a CFET with different top fin and bottom fin numbers in accordance with some embodiments.

FIG. 1 through FIGS. 19A, 19B, and 19C illustrate the cross-sectional views of intermediate stages in the monolithic formation of a Complementary FET (CFET) with bottom fin-cut in accordance with some embodiments. The corresponding processes are also reflected schematically in the process flow shown in FIG. 44.

FIG. 1 illustrates a perspective view of an initial structure. The initial structure includes wafer 10, which further includes substrate 20. Substrate 20 may be a semiconductor substrate, which may be a silicon substrate or a substrate formed of other semiconductor materials such as silicon germanium, carbon-doped silicon, or the like. In subsequent paragraphs, substrate 20 is referred to as a silicon substrate, while it may be formed of other semiconductor materials.

Figure 19C:
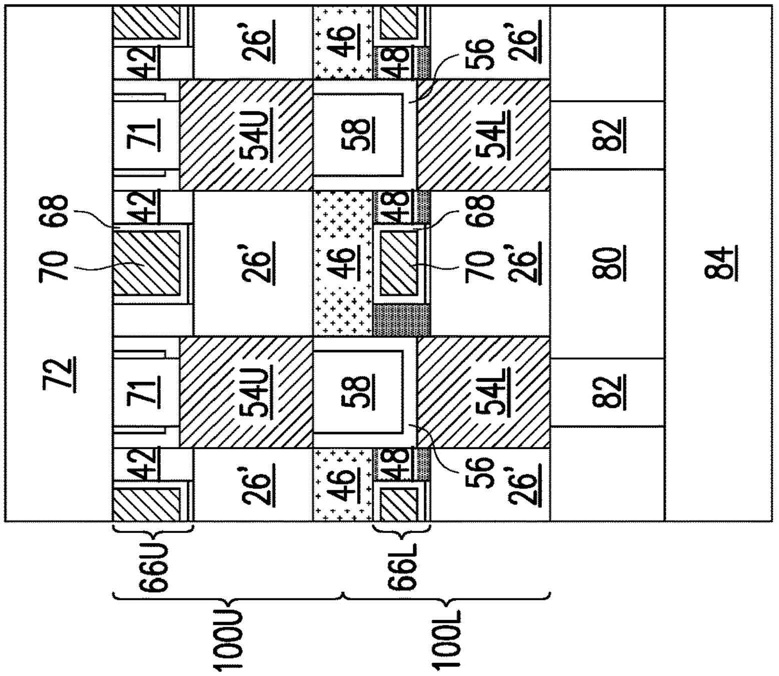
Figure 19B:
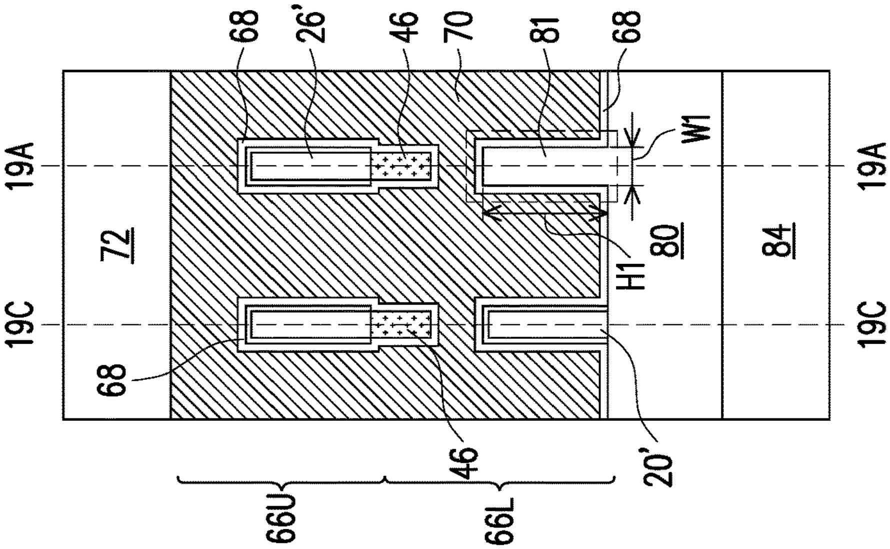
Figure 19A:
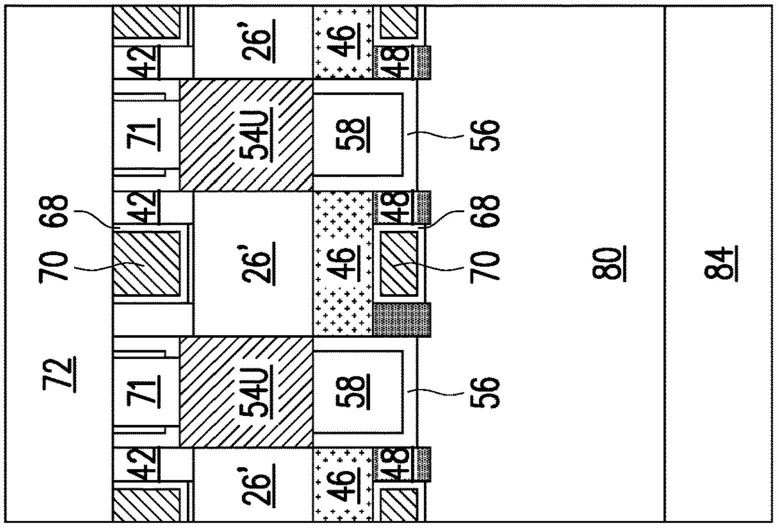

Dummy (sacrificial) layers 22 and 24 are deposited over substrate 20. Sacrificial layers 22 and 24 may be formed of different material that have adequate etching selectivity in subsequent processes. In accordance with some embodiments, sacrificial layer 22 may be formed of silicon germanium with a first germanium atomic percentage. Sacrificial layer 24 may be formed of silicon germanium with a second germanium atomic percentage that is higher than the first germanium atomic percentage. The difference between the second germanium atomic percentage and the first germanium atomic percentage may be higher than about 30 percent, and may be in the range between about 30 percent and about 70 percent. Sacrificial layer 24 may also be formed of germanium without including silicon therein. Alternatively, layer 24 may be a dielectric layer such as a silicon oxide layer. In which case, layer 24 is not sacrificial, and will remain in the final structure to have the function of dielectric layer 46 (FIGS. 19A, 19B, and 19C).

Semiconductor layer 26 is formed over sacrificial layer 24. Semiconductor layer 26 is formed of a channel material that is suitable for forming channels of the upper FETs. In accordance with some embodiments, semiconductor layer 26 is formed of silicon (and may or may not include germanium). Throughout the description, semiconductor layer 26 is referred to as silicon layer 26, while it may also be formed of other semiconductor materials.

In accordance with some embodiments, sacrificial layers 22 and 24 and silicon layer 26 may be formed through epitaxy, so that silicon layer 26 has a crystalline structure. Substrate 20 and silicon layer 26 may be doped with proper n-type or p-type dopant to form well regions for the corresponding FinFET. Hard mask 28 is deposited over silicon layer 26. In accordance with some embodiments, hard mask 28 comprises silicon nitride, silicon oxide, silicon oxynitride, or the like.

Figure 2:
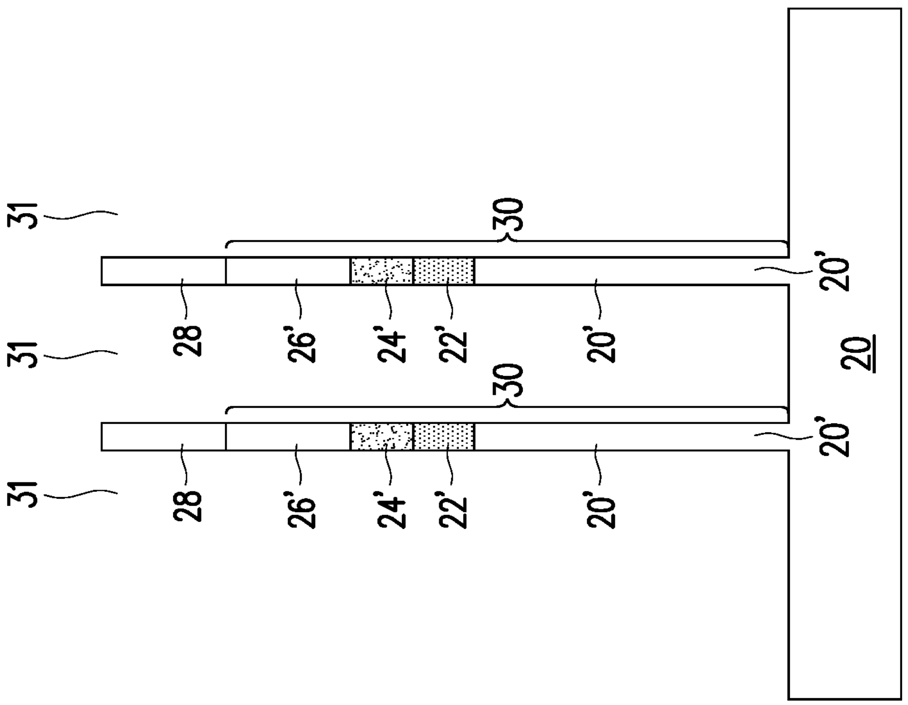

Hard mask 28 is then patterned, followed by etching the underlying silicon layer 26, sacrificial layers 22 and 24, and silicon substrate 20. The resulting structure is shown in FIG. 2. Fins 30 are thus formed, with trenches 31 being formed on opposing sides of fins 30. Fins 30 include silicon strips 20' and 26', which are parts of the original substrate 20 and silicon layer 26, respectively. Fins 30 further include sacrificial strips 22' and 24', which are the remaining parts of sacrificial layers 22 and 24, respectively.

Figure 3B:
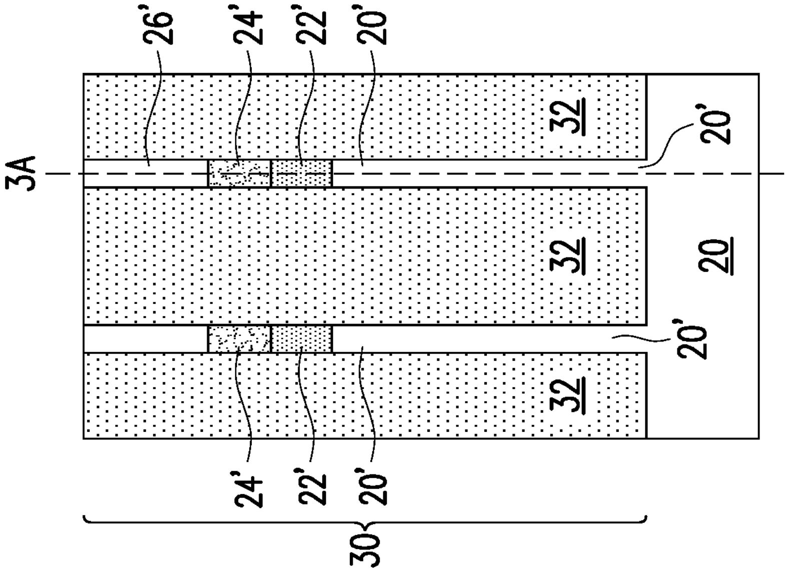
Figure 3A:
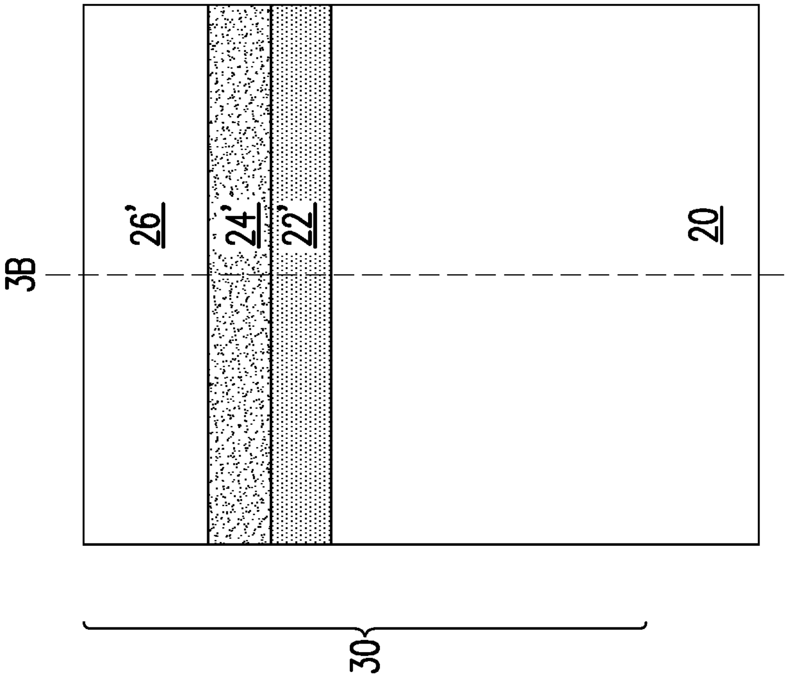

Referring to FIGS. 3A and 3B, Shallow Trench Isolation (STI) regions 32 are formed. FIGS. 3A and 3B illustrate cross-sectional views, wherein FIG. 3A illustrates the cross-section 3B-3B in FIG. 3A, and FIG. 3B illustrates the cross-section 3A-3A in FIG. 3B. In subsequent FIGS. 4A and 4B through 19A and 19B, the figures whose numbers including letter "A" are also obtained from the same cross-section as shown in FIG. 3A, and the figures whose numbers including letter "B" are also obtained from the same cross-section as shown in FIG. 3B.

The formation process of STI regions 32 may include depositing dielectric layers, and performing a planarization process to remove excess portions of the dielectric materials. STI regions 32 may include a liner dielectric (not shown), which may be a thermal oxide formed through the thermal oxidation of a surface layer of substrate 20. The liner dielectric may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 32 may also include a dielectric material over the liner dielectric, wherein the dielectric material may be formed using ALD, Flowable Chemical Vapor Deposition (FCVD), spin-on coating, or the like.

Figure 4B:
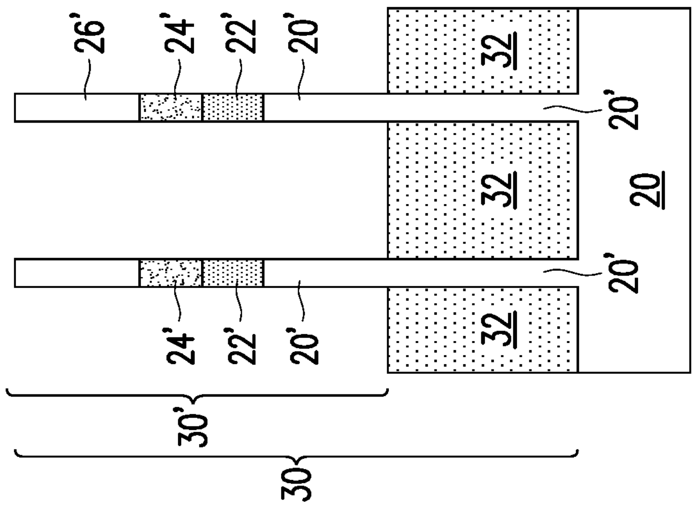
Figure 4A:
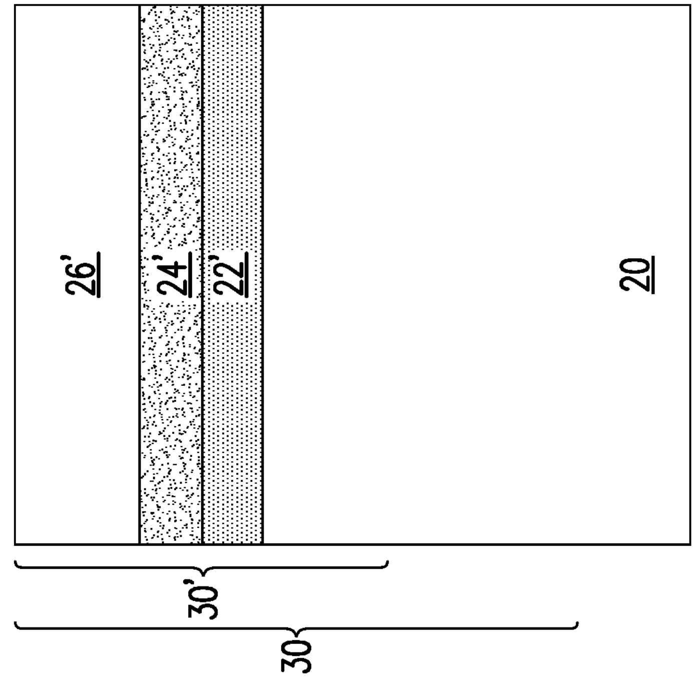

Referring to FIGS. 4A and 4B, STI regions 32 are recessed, so that the top portions of fins 30 protrude higher than the top surfaces of the remaining portions of STI regions 32 to form protruding fins 30'. The portions of the semiconductor strips 20' protruding higher than the top surfaces of the remaining STI regions 32 are referred to as protruding silicon fins 20' hereinafter. The etching may be performed using a dry etching process, wherein HF and $NH_3$, for example, being used as the etching gases. During the etching process, plasma may be generated. Argon may also be included. In accordance with alternative embodiments of the present disclosure, the recessing of STI regions 32 is performed using a wet etch process. The etching chemical may include HF, for example. Protruding fins 30' include some portions of silicon strips 20', which are used for forming bottom FinFET.

Figure 5B:
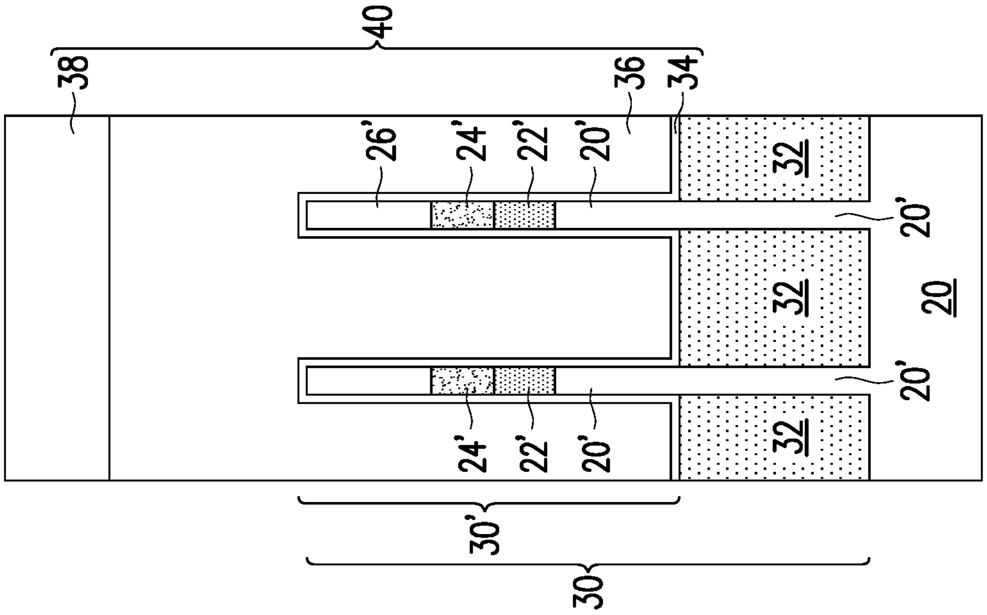
Figure 5A:
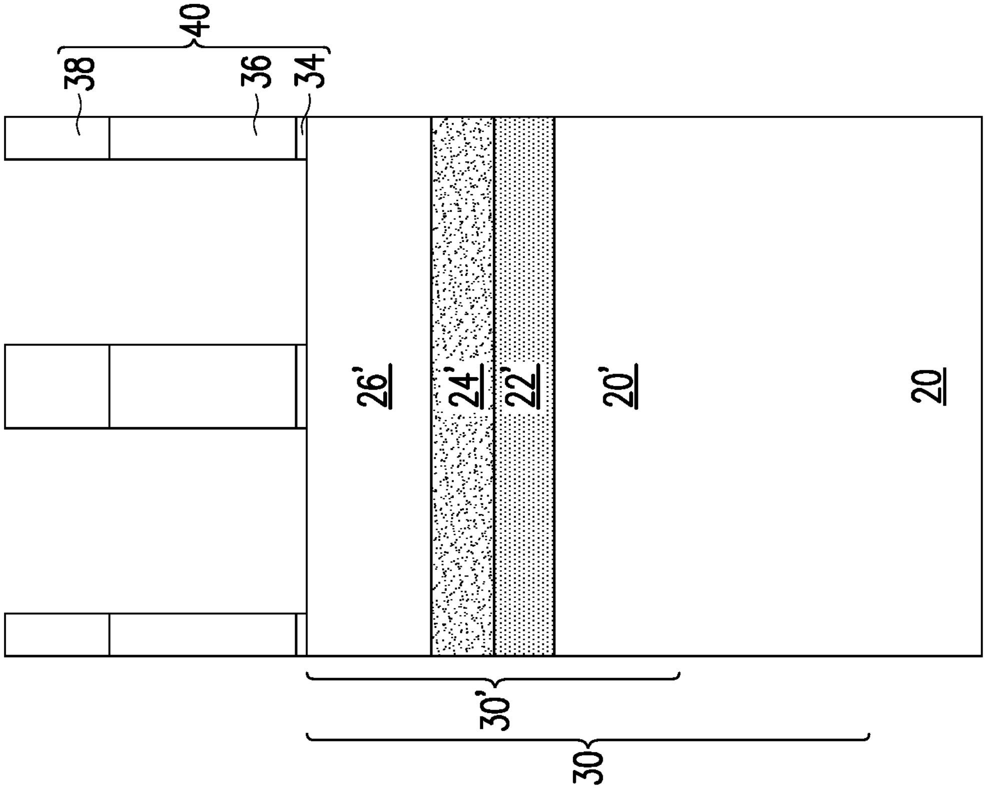

Referring to FIGS. 5A and 5B, dummy gate stacks 40 are formed on the top surfaces and the sidewalls of (protruding) fins 30'. Dummy gate stacks 40 may include dummy gate dielectrics 34 and dummy gate electrodes 36 over dummy gate dielectrics 34. Dummy gate dielectrics 34 may be formed of or comprise silicon oxide. Dummy gate electrodes 36 may be formed, for example, using polysilicon or amorphous silicon, and other materials may also be used. Each of dummy gate stacks 40 may also include one (or a plurality of) hard mask layer 38 over dummy gate electrodes 36. Hard mask layers 38 may be formed of silicon nitride, silicon oxide, silicon carbo-nitride, or multi-layers thereof. Dummy gate stacks 40 may cross over a plurality of protruding fins 30' and STI regions 32.

Figure 6B:
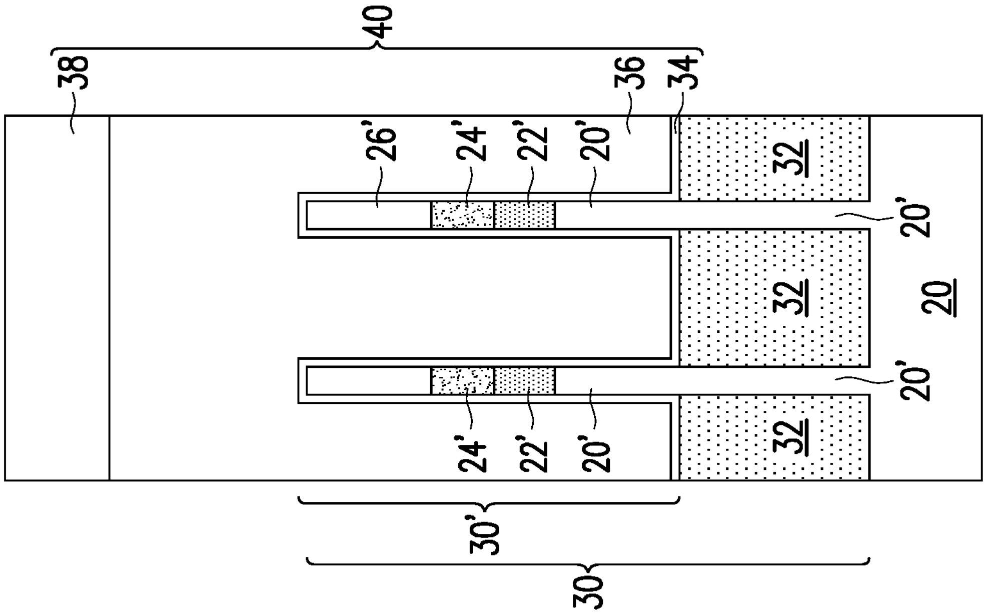
Figure 6A:
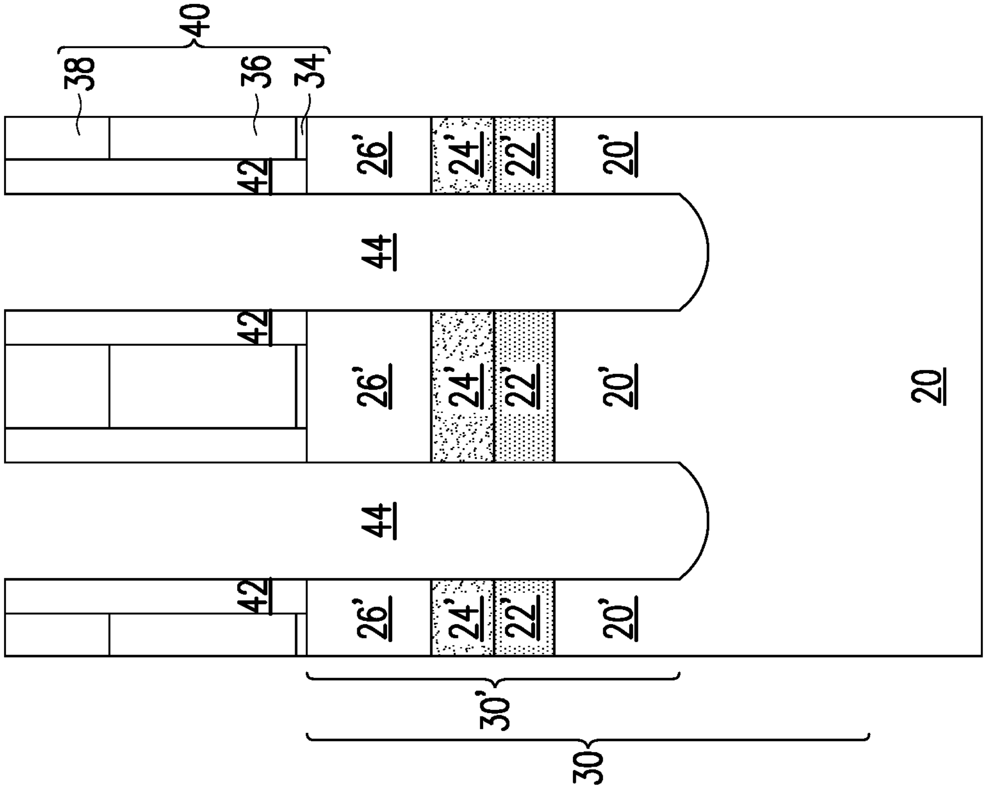

Next, as shown in FIGS. 6A and 6B, gate spacers 42 are formed on the sidewalls of dummy gate stacks 40. In accordance with some embodiments of the present disclosure, gate spacers 42 are formed of a dielectric material such as silicon nitride, silicon carbo-nitride, or the like, and may have a single-layer structure or a multi-layer structure including a plurality of dielectric layers.

A recessing process is then performed to etch the portions of protruding fins 30' that are not covered by dummy gate stacks 40 and gate spacers 42, forming recesses 44. The recessing may be anisotropic, and hence the portions of protruding fins 30' directly underlying dummy gate stacks 40 and gate spacers 42 are protected, and are not etched. The bottom surfaces of the recesses 44 may be lower than the top surfaces of STI regions 32 in accordance with some embodiments. Recesses 44 are located on the opposite sides of dummy gate stacks 40.

Figure 7B:
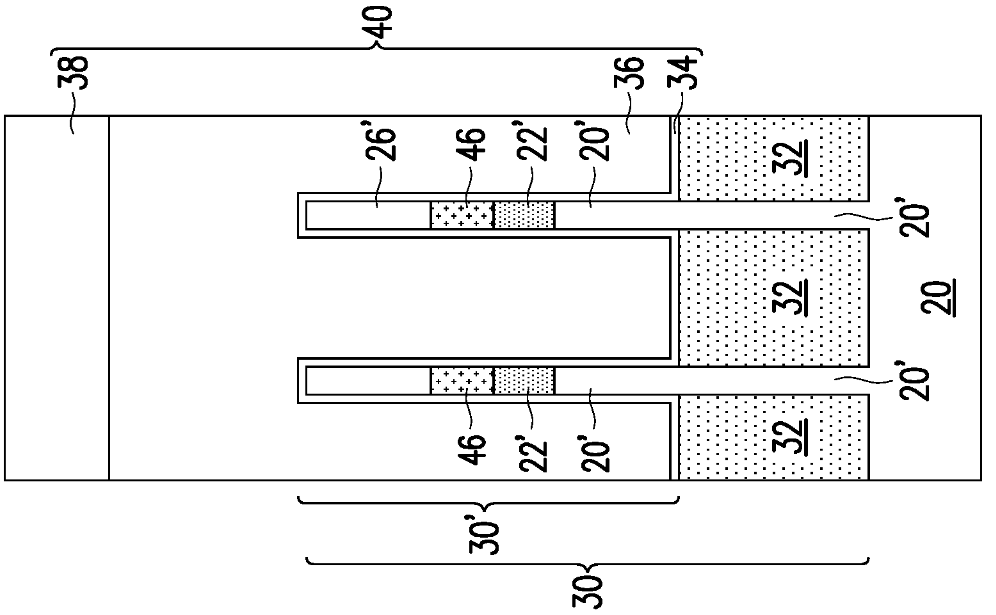
Figure 7A:
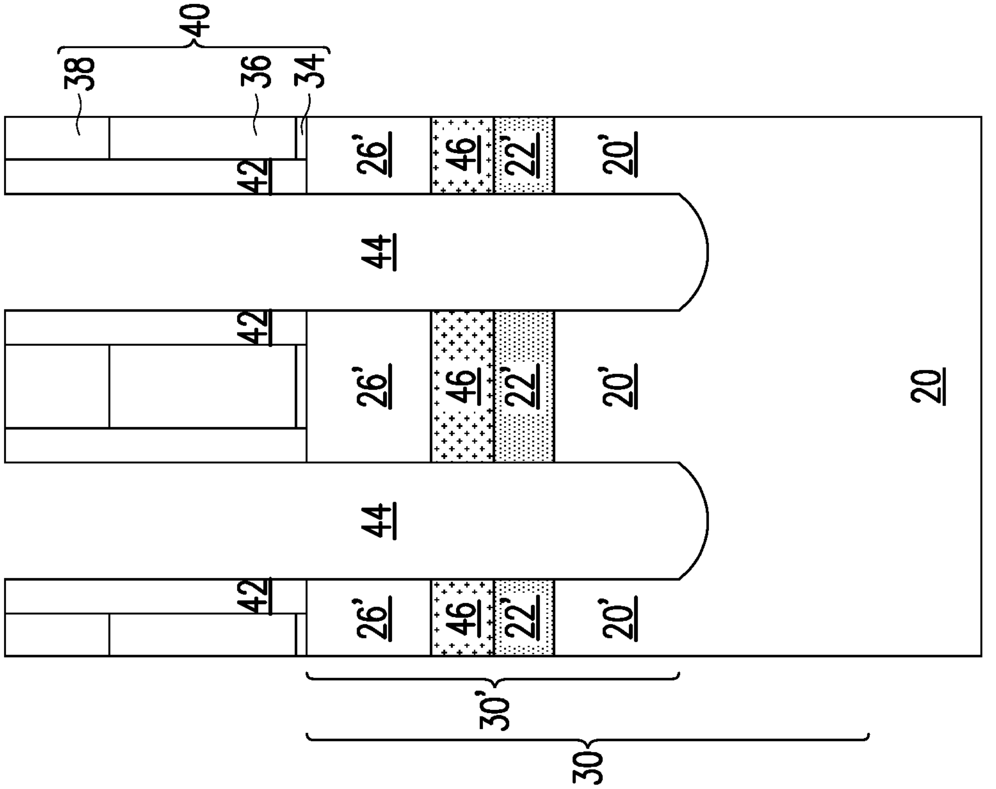

Next, sacrificial strips 24' are removed, and are replaced with middle dielectric layers 46, as shown in FIGS. 7A and 7B. In accordance with some embodiments, sacrificial strips 24' are removed in an etching process. The etching is selective to sacrificial strips 22' and silicon strips 20' and 26', and these features have significantly lower etching rate (for example, lower than 10 percent or 5 percent) than the etching of sacrificial strips 24'. For example, since sacrificial strips 24' have a higher germanium atomic percentage than sacrificial strips 22' (also referred to fins) and silicon strips 26' (also referred to fins), a chlorine gas may be used as the etching gas to generate the etching selectivity. Sacrificial strips 24' are fully removed.

Middle dielectric layers 46 are formed in the spaces left by the removed sacrificial strips 24'. Middle dielectric layers 46 may be formed by conformally depositing (for example, using ALD, CVD, or the like) a dielectric material in recesses 44 and further extending into the recesses left by the removed sacrificial strips 24'. The dielectric material is then etched, for example, in an anisotropic etching process and/or an isotropic etching process. Middle dielectric layers 46 may be formed of materials selected from silicon oxide, silicon nitride, silicon carbide, silicon oxycarbonitride, silicon oxycarbide, silicon oxynitride, hafnium oxide, zirconium oxide, or the like, combinations thereof, and composite layers thereof.

Figure 8B:
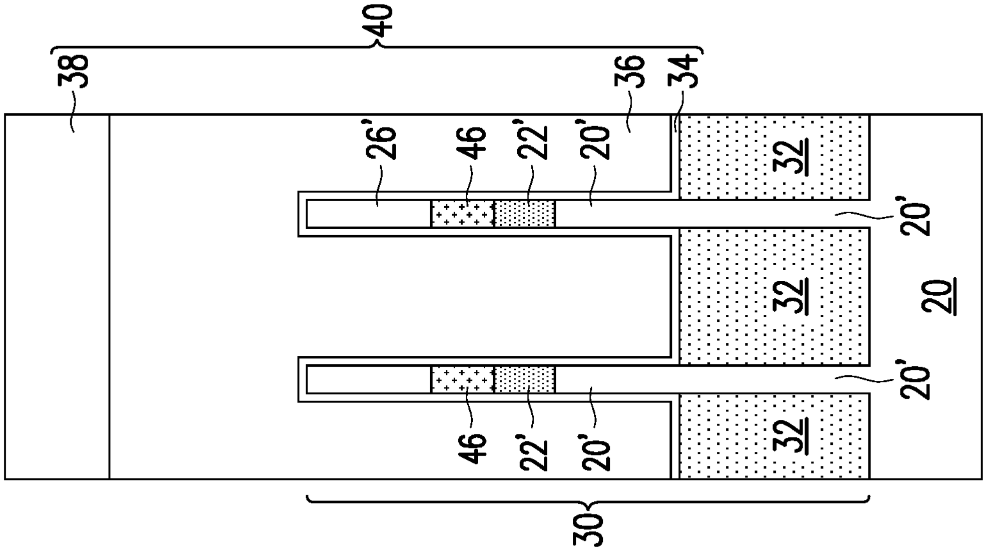
Figure 8A:
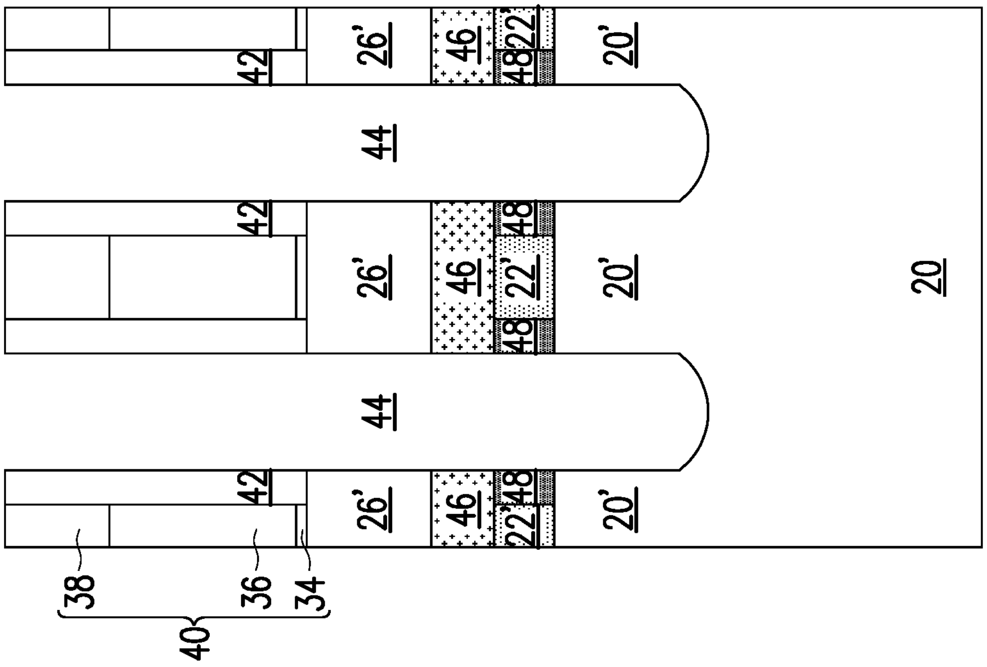

FIGS. 8A and 8B illustrate the formation of inner spacers 48. The formation process may include laterally recessing inner spacers 48 in an etching process, performing a deposition process to fill the lateral recesses with a dielectric layer, and performing an etching process to remove the portions of the dielectric material outside of the lateral recesses. The material of inner spacers 48 may be different from or the same as the material of middle dielectric layers 46.

Figure 9B:
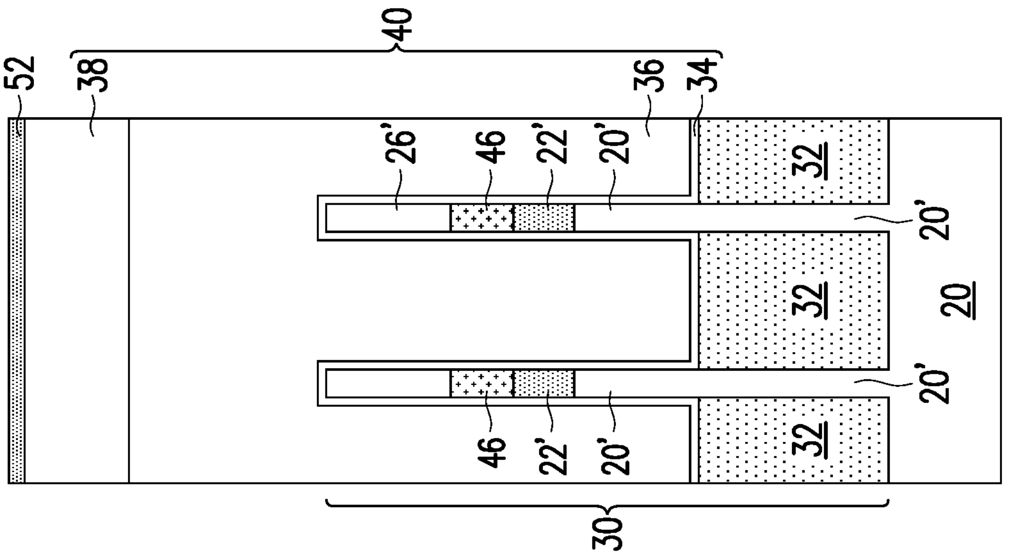
Figure 9A:
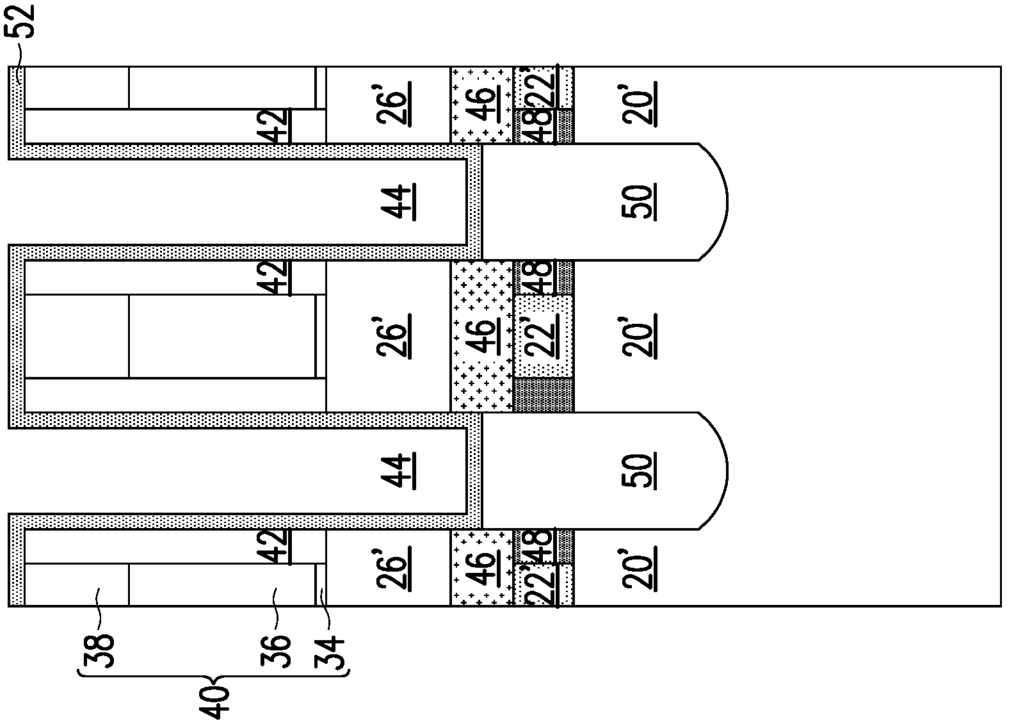

In FIGS. 9A and 9B, sacrificial regions 50 are formed in the lower portions of the recesses 44. The formation process may include forming a dielectric material, planarizing the dielectric material, and etching back the dielectric material. Acceptable dielectric materials may include silicon carbide, silicon oxide, silicon nitride, silicon oxynitride, silicon oxycarbonitride, combinations thereof, or the like, which may be formed by a deposition process such as CVD, ALD, FCVD, or the like. In some embodiments, the sacrificial regions 50 are formed of silicon oxycarbonitride. The top surfaces of sacrificial regions 50 may be between the top surfaces and the bottom surfaces of middle dielectric layers 46.

Dummy isolation layer 52 is then deposited as a conformal layer and extending into recesses 44. The applicable dielectric materials may include a material having a high etching selectivity to sacrificial regions 50, which material may be selected from silicon oxide, silicon nitride, aluminum oxide, silicon oxynitride, silicon oxycarbonitride, combinations thereof, or the like. The deposition process may include CVD, ALD, or the like. Dummy isolation layer 52 is then etched in an anisotropic etching process, forming the dummy spacers 52' as shown in FIG. 10A.

The sacrificial regions 50 are then removed, for example, through a dry etch process, a wet etch process, the like, or a combination thereof. The etching may be isotropic. The etching is selective to dummy spacers 52'. Removing the sacrificial regions 50 exposes the sidewalls of silicon strips 20'.

Figure 10B:
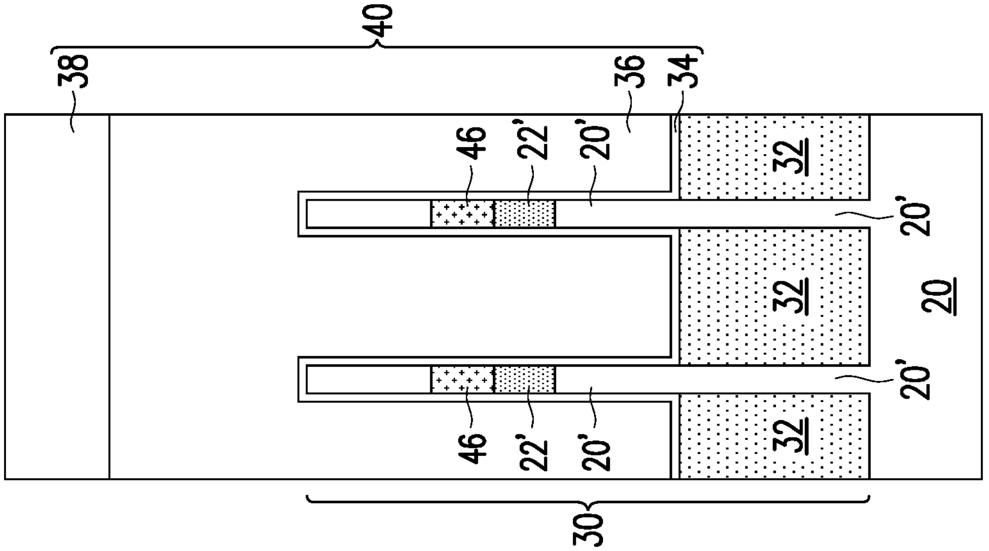
Figure 10A:
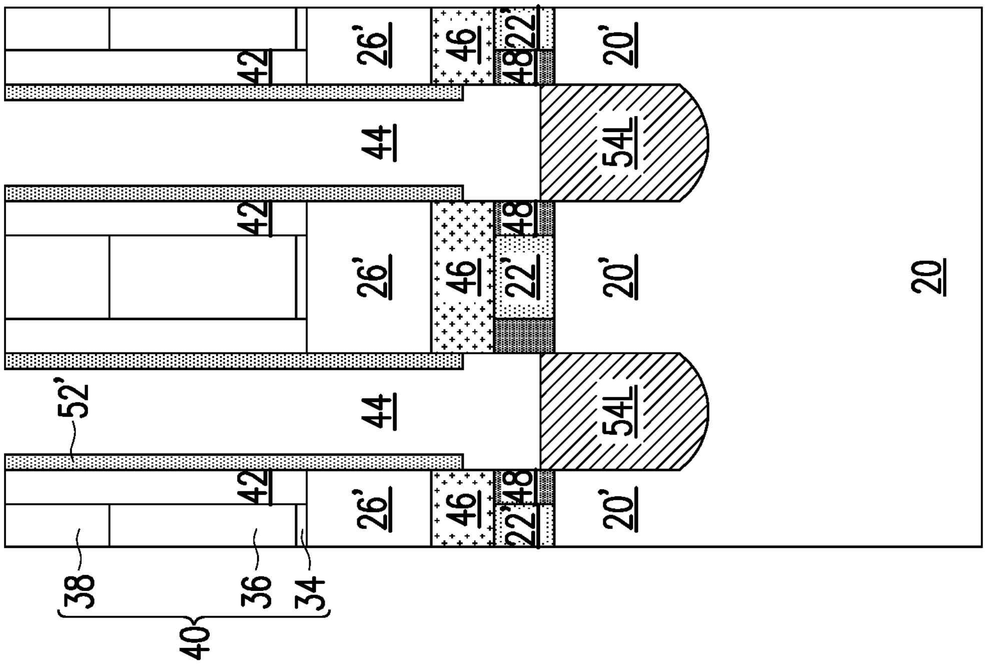

In FIGS. 10A and 10B, lower epitaxial source/drain regions 54L are formed in the lower portions of the recesses 44. Source/drain regions refer to source and/or drain regions, depending on the context. The lower epitaxial source/drain regions 54L are in contact with silicon fins 20' and are not in contact with silicon fins 26'. Inner spacers 48 electrically insulate the lower epitaxial source/drain regions 54L from the sacrificial layers 22', which will be replaced with replacement gates in subsequent processes.

The lower epitaxial source/drain regions 54L are epitaxially grown, and have a conductivity type that is suitable for the device type (p-type or n-type) of the lower nanostructure-FETs. When lower epitaxial source/drain regions 54L are n-type source/drain regions, the respective material may include silicon or carbon-doped silicon, which is doped with an n-type dopant such as phosphorous, arsenic, and/or the like. When lower epitaxial source/drain regions 54L are p-type source/drain regions, the respective material may include silicon or silicon germanium, which is doped with a p-type dopant such as boron, indium, and/or the like.

Dummy spacers 52' are then removed, for example, through an isotropic etching process, so that the sidewalls of silicon fins 26' are exposed.

Figure 11B:
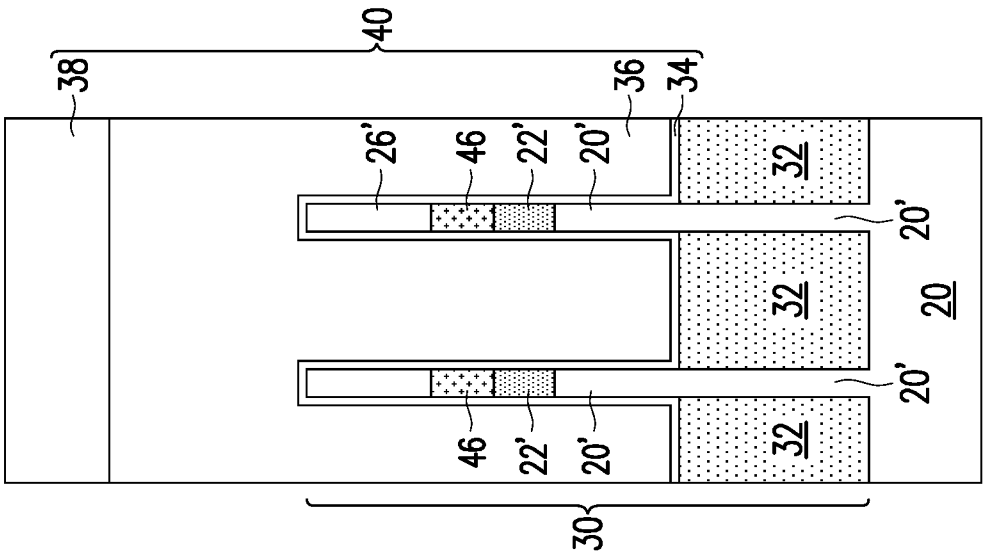
Figure 11A:
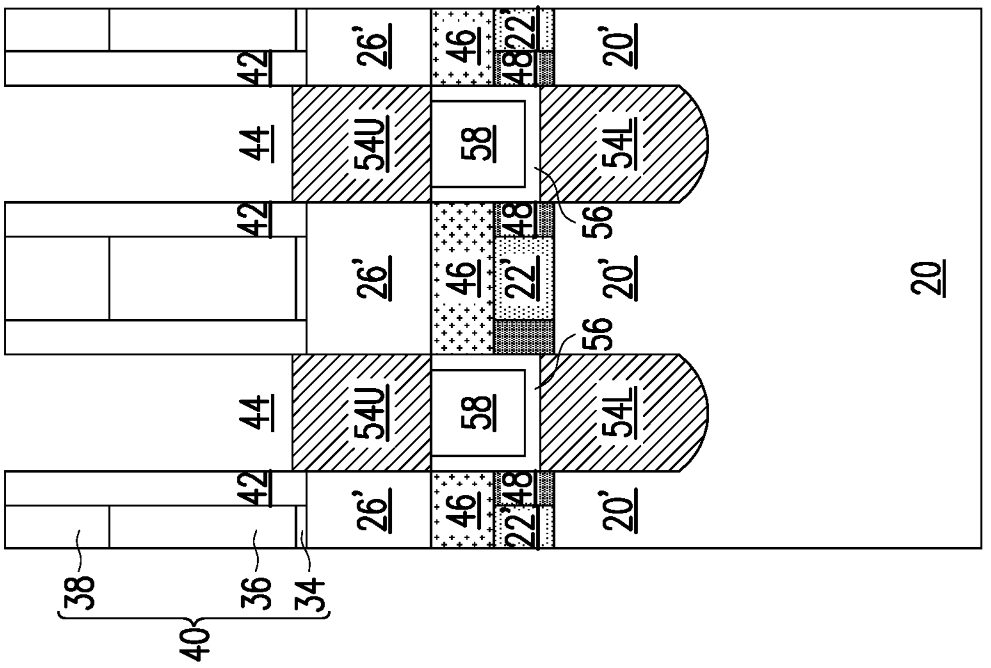

Further referring to FIGS. 11A and 11B, a first Contact Etch Stop Layer (CESL) 56 and a first Inter-Layer Dielectric (ILD) 58 are formed. The first CESL 56 may be formed of a dielectric material having a high etching selectivity from the etching of the first ILD 58, such as silicon nitride, silicon oxide, silicon oxynitride, or the like, which may be formed by any suitable deposition process, such as CVD, ALD, or the like. The first ILD 58 may be formed of a dielectric material, which may be deposited by any suitable method, such as CVD, plasma-enhanced CVD (PECVD), or FCVD. The applicable dielectric material of the first ILD 58 may include phospho-silicate glass (PSG), boro-silicate glass (BSG), boron-doped phospho-silicate glass (BPSG), undoped silicate glass (USG), silicon oxide, or the like.

The formation of the first CESL 56 and the first ILD 58 may include depositing a conformal CESL layer, depositing a material for the first ILD 58, followed by a planarization process and then an etch-back process. After the etch-back process, the sidewalls of silicon fins 26' are exposed.

FIGS. 11A and 11B further illustrates the formation of upper epitaxial source/drain regions 54U in the upper portions of the recesses 44. The materials of upper epitaxial source/drain regions 54U may be selected from the same group of candidate materials for forming lower source/drain regions 54L, depending on the desired conductivity type of upper epitaxial source/drain regions 54U. The conductivity type of the upper epitaxial source/drain regions 54U may be opposite the conductivity type of the lower epitaxial source/drain regions 54L.

Figure 12B:
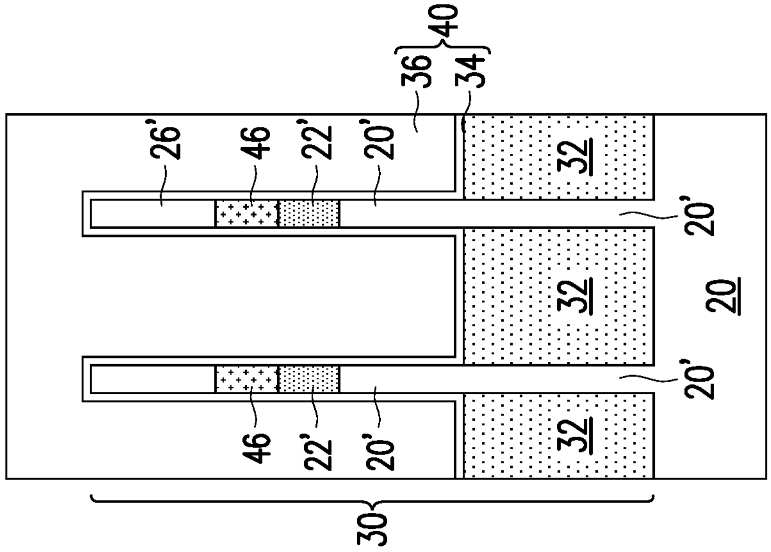
Figure 12A:
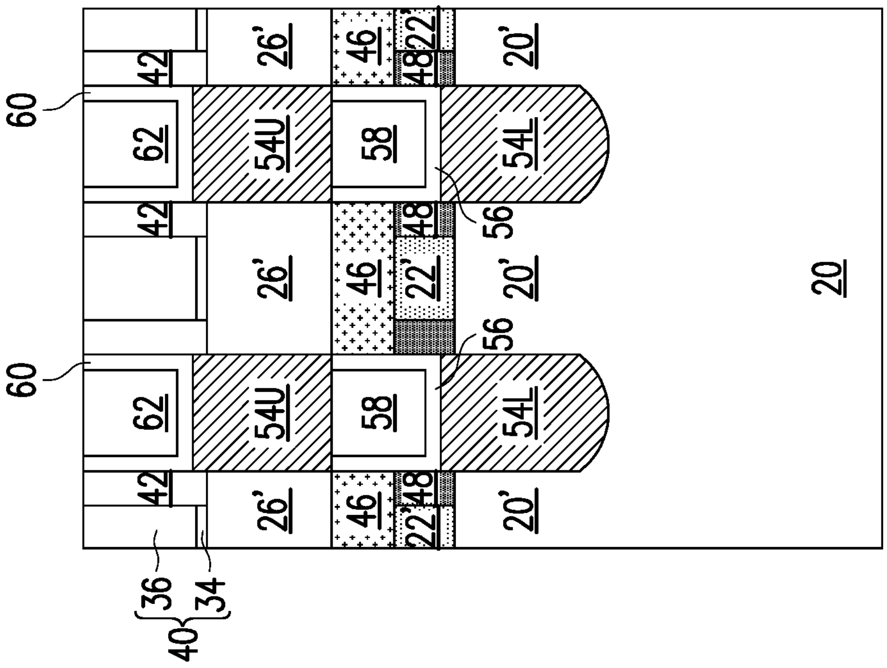

In FIGS. 12A and 12B, a second CESL 60 and a second ILD 62 are formed. The materials and the formation methods may be similar to the materials and the formation methods of the first CESL 56 and first ILD 58, respectively, and are not discussed in detail herein. The formation process may include depositing the layers for CESL 60 and ILD 62, and performing a planarization process to remove the excess portion of the corresponding layers. After the planarization process, the top surfaces of the second ILD 62, the gate spacers 42, and the dummy gate stacks 40 are coplanar (within process variations). The planarization process may remove hard mask layers 38, or leave hard masks hard mask layers 38 unremoved.

Figure 13B:
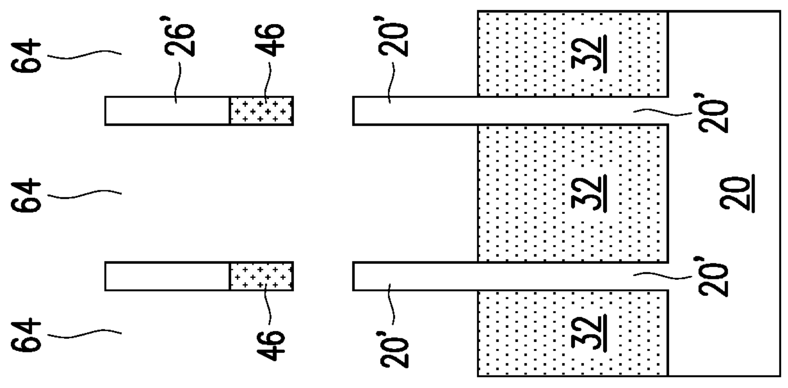
Figure 13A:
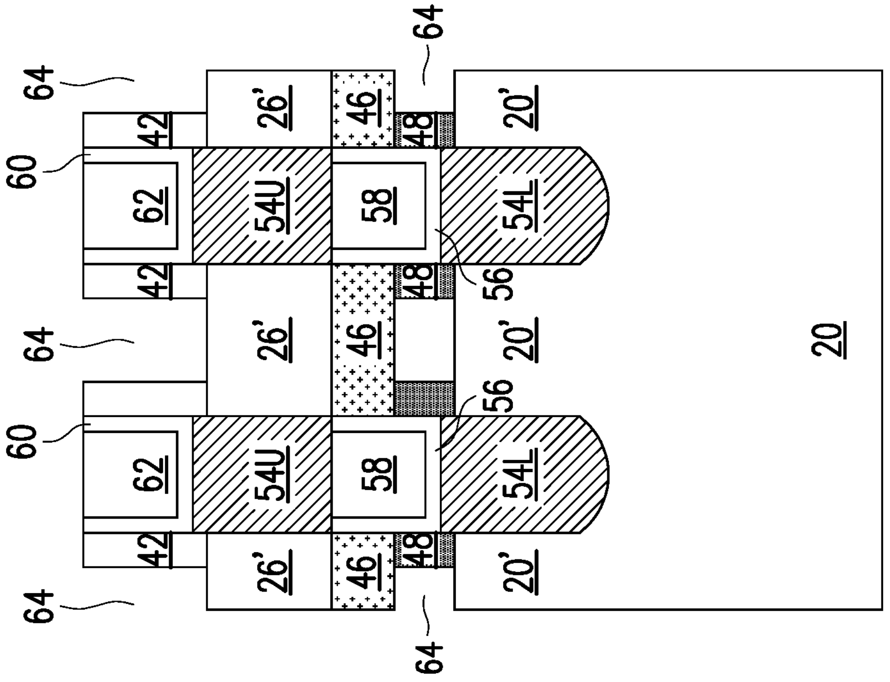

Next, the dummy gate stacks 40 are removed in one or more etching processes, so that recesses 64 are formed, as shown in FIGS. 13A and 13B. The respective process is illustrated as process 230 in the process flow 200 as shown in FIG. 30. Silicon fins 26' and 20' are exposed to recesses 64. Throughout the description, silicon fins 26' and 20' are also alternatively referred to as (protruding) fins 26' and 20', respectively.

Figure 14B:
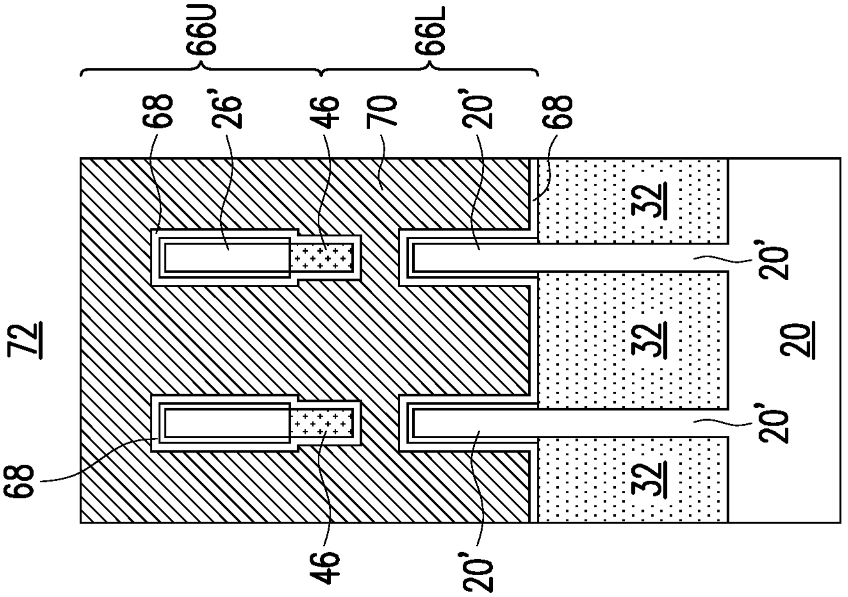
Figure 14A:
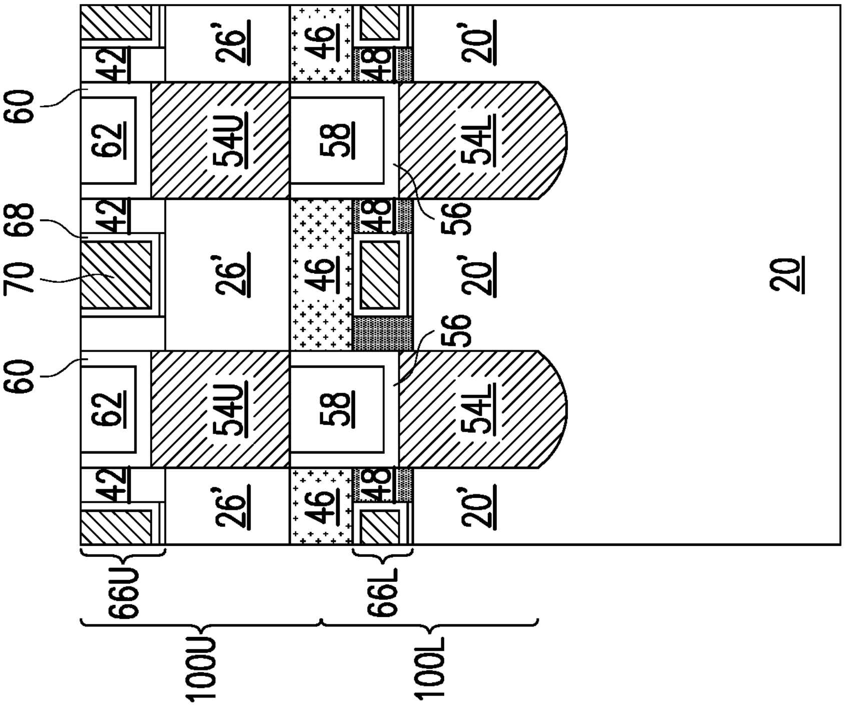

FIGS. 14A and 14B illustrate the formation of replacement gate stacks 66U and 66L. The formation process includes depositing dielectric layers and conductive layers extending into recesses 64, and performing a planarization process such as a CMP process or a mechanical grinding process to remove excess portions of the deposited layers. In accordance with some embodiments, gate stacks 66 include gate dielectrics 68 (including an interfacial layer and a high-k dielectric layer(s)), and gate electrodes 70. The interfacial layers may include silicon oxide. The high-k dielectric layer may include hafnium oxide, zirconium oxide, lanthanum oxide, and/or the like. Gate electrodes 70 may include TiN, TiSiN, TaN, TiAlN, TiAl, cobalt, tungsten, and/or the like. Accordingly, gate electrodes 70 are also referred to as metal gates 70. Replacement gate stacks 66U and 66L form parts of the upper FinFET 100U and lower FinFET 100L, respectively, which collectively form a CFET.

Figure 15B:
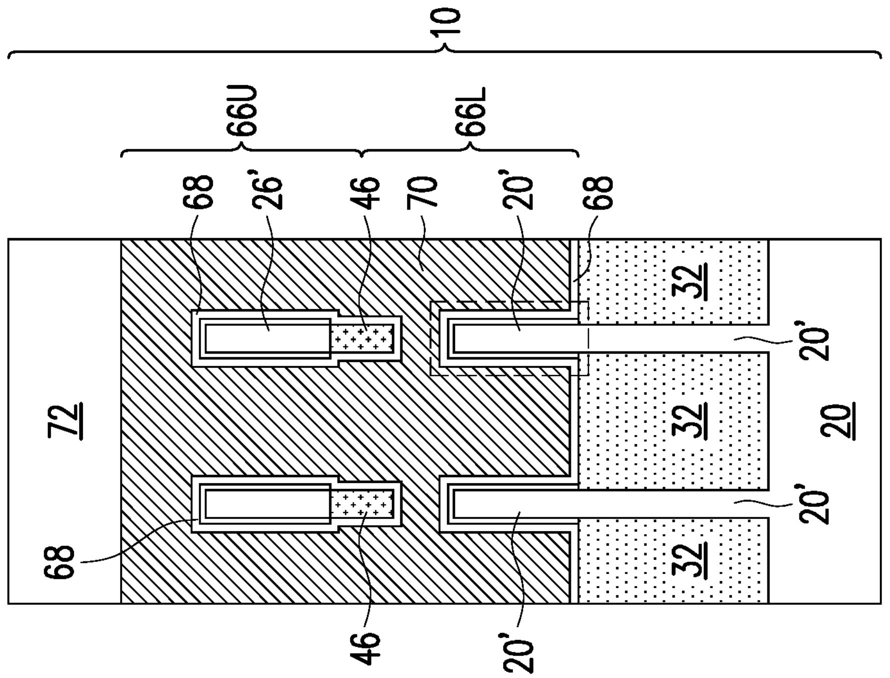
Figure 15A:
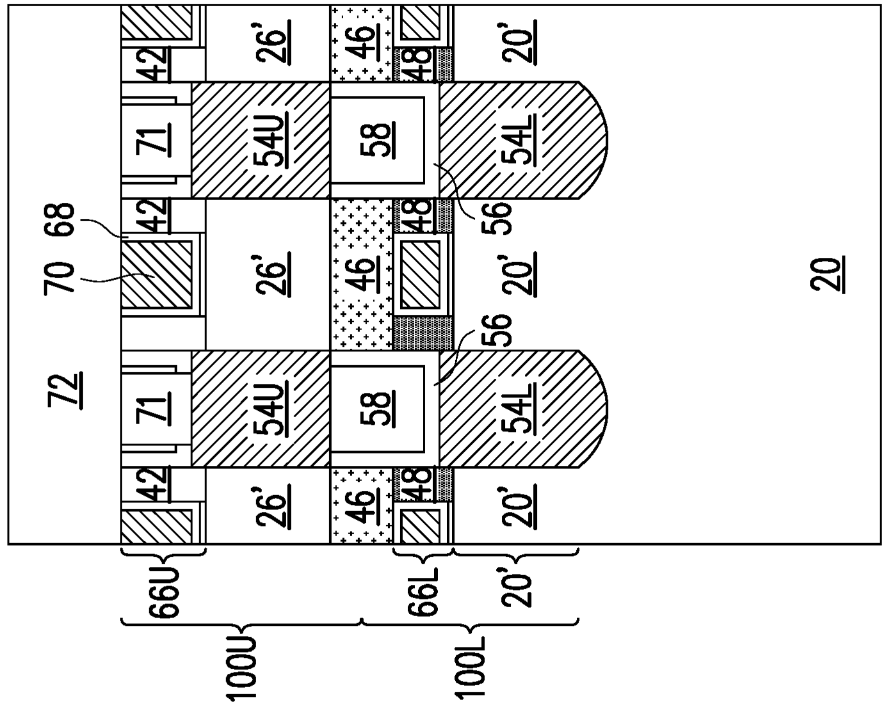

FIGS. 15A and 15B illustrate source/drain contact plugs 71 and the front-side interconnect structure 72. The details of the front-side interconnect structure 72 are not illustrated. The formation of contact plugs 71 may include etching ILD 62 and CESL 60 (FIGS. 14A and 14B) to form source/drain contact openings, and filling the source/drain contact openings with a conductive material(s). Source/drain silicide regions (not shown) may also be formed between source/drain regions 54U and contact plugs 71. The front-side interconnect structure 72 includes dielectric layers and a plurality of layers of conductive features in the dielectric layers. The dielectric layers may include low-k dielectric layers formed of low-k dielectric materials, and may further include passivation layers over the low-k dielectric materials. The passivation layers may be formed of non-low-k and dense dielectric materials such as Undoped Silicate-Glass (USG), silicon oxide, silicon nitride, or the like, or combinations thereof. The dielectric layers may also include polymer layers.

The conductive features may include contact plugs, conductive lines, and conductive vias, which may be formed using damascene processes. The conductive features may include metal lines and metal vias, which include diffusion barriers and a copper-containing material over the diffusion barriers. There may also be aluminum pads over and electrically connected to the metal lines and vias. Depending on how the respective die is to be packaged, the top features among the conductive features may include bond pads, metal pillars, solder regions, and/or the like.

Figure 16B:
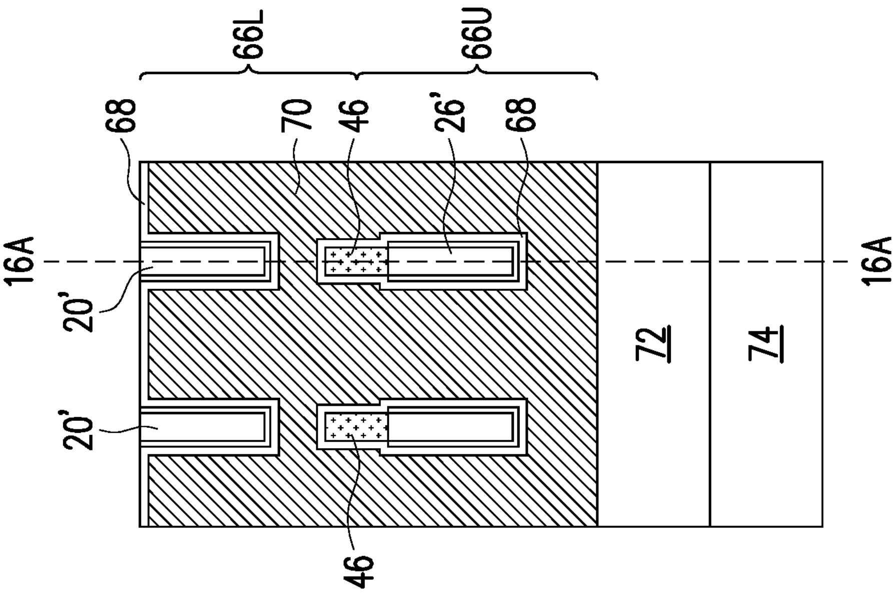
Figure 16A:
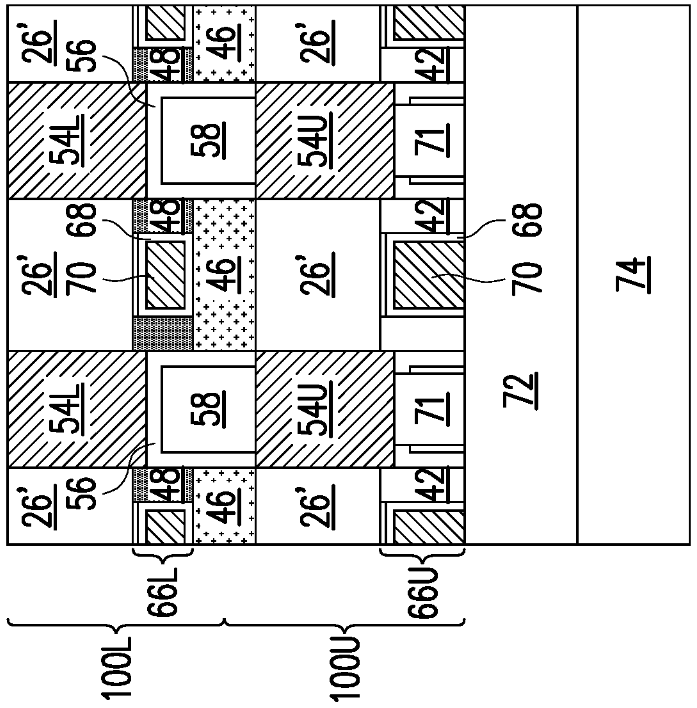

FIGS. 16A and 16B illustrate the attachment of carrier 74, which is attached to the front-side interconnect structure 72 of wafer 10. FIG. 16A illustrates the cross-section 16A-16A in FIG. 16B. In accordance with some embodiments, carrier 74 includes a glass carrier, which may be attached to the front-side interconnect structure 72 through an adhesive, such as a light-to-heat-conversion (LTHC) material. In accordance with alternative embodiments, carrier 74 may include a silicon wafer, which may be attached to the front-side interconnect structure 72, for example, through fusion bonding.

A backside thinning process may then be performed on the backside of wafer 10. The backside thinning process may be performed through a CMP process, a mechanical grinding process, or the like. The backside thinning process may be stopped on gate dielectrics 68 in accordance with some embodiments. Alternatively, the backside thinning process may be stopped on gate electrodes 70. The protruding silicon fins 20' are thus exposed.

Figure 17B:
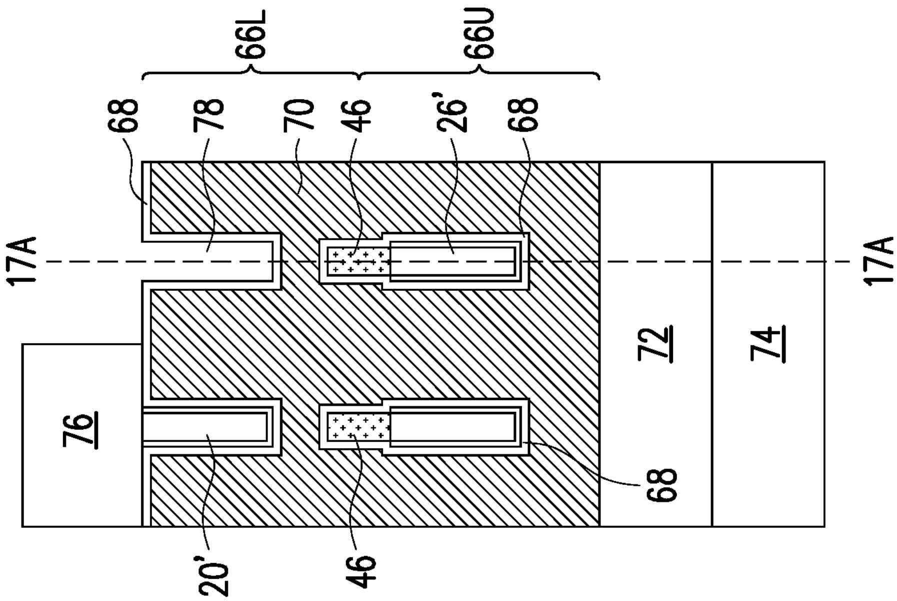
Figure 17A:
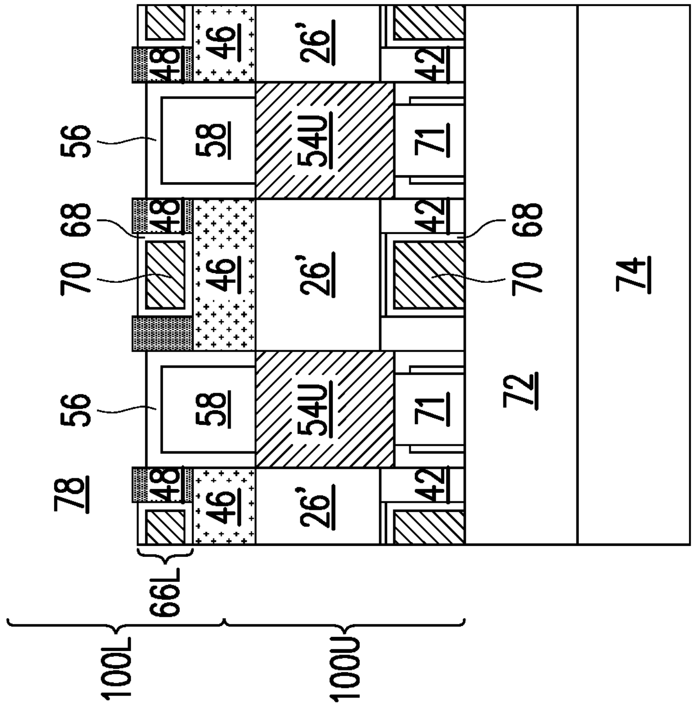

FIGS. 17A and 17B illustrate the bottom fin-cut process in accordance with some embodiments. FIG. 17A illustrates the cross-section 17A-17A in FIG. 17B. Etching mask 76 is formed, which may include a photoresist. Etching mask 76 may be a single-layer etching mask, a tri-layer etching mask, or the like. Etching mask 76 covers some of protruding silicon fins 20', leaving another one(s) of protruding silicon fins 20' exposed. An etching process is then performed to remove the exposed protruding silicon fin(s) 20'. In accordance with some embodiments, the etching is performed using gate dielectrics 68 (such as the interfacial layers or the high-k dielectric layers in gate dielectrics 68) as an etch stop layer. In accordance with alternative embodiments, gate dielectrics 68 are also etched, and the etching is stopped on gate electrodes 70. The spaces left by the removed fins 20' are referred to as recesses 78.

In the example embodiments as illustrated, two fins are formed, in which one fin is etched. It is appreciated that the FinFETs may include any number of protruding fins, and any number of fins may be removed in the fin-cut process, with at least one or more fin remaining after the fin-cut process.

Figure 18B:
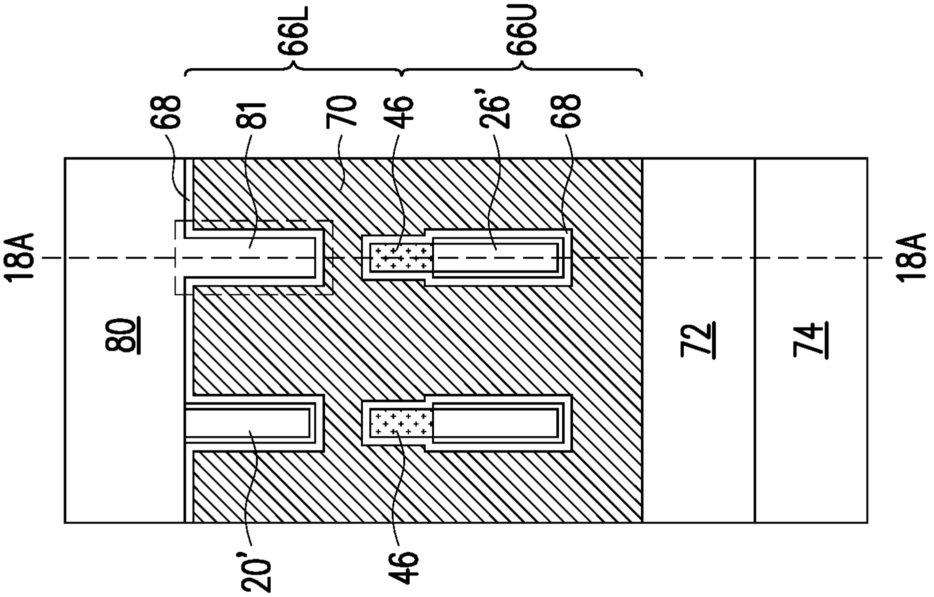
Figure 18A:
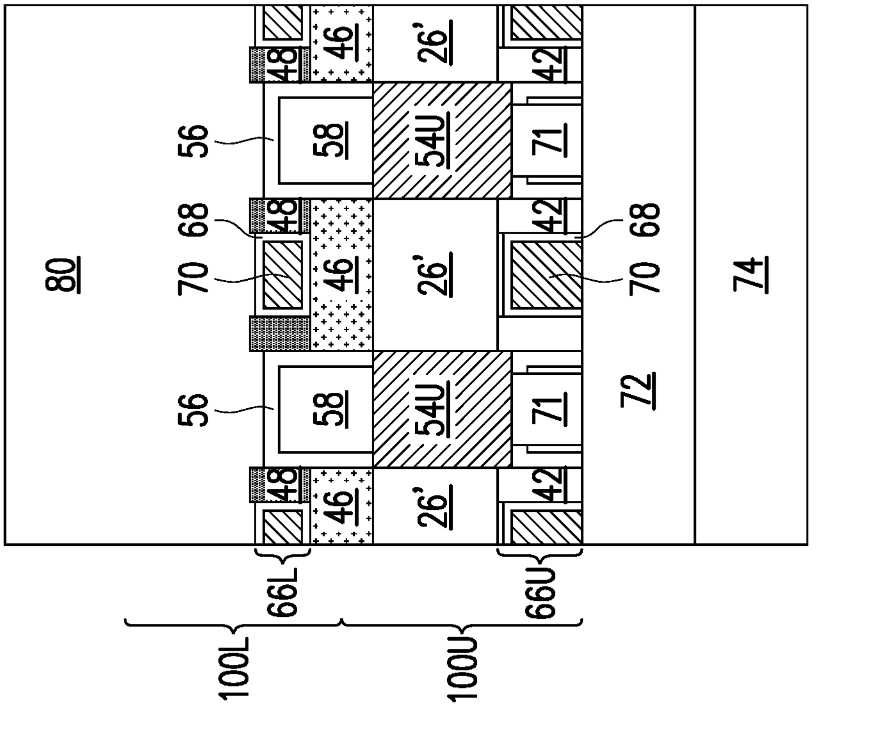

Etching mask 76 is then removed, as shown in FIGS. 18A and 18B. FIG. 18A illustrates the cross-section 18A-18A in FIG. 18B. Dielectric layer 80 is then deposited, followed by a planarization process. Dielectric layer 80 may be formed of a material selected from $SiO_2$. SiN, SION, SiCN, SiOCN, SiOC, $Al_2O_3$, $HfO_2$, $ZrO_2$, SiC, combinations thereof, multi-layers thereof. A portion of dielectric layer 80 fills the recesses 78 and form dielectric fin(s) 81, which is formed of a same material as dielectric layer 80.

FIGS. 19A and 19B illustrate the structure formed after the formation of backside interconnect structure 84. In addition, FIG. 19C is illustrated to show the formation of backside contact plugs 82, which electrically connect the lower source/drain regions 54L to backside interconnect structure 84. FIG. 19A illustrates the cross-section 19A-19A in FIG. 19B, and FIG. 19C illustrates the cross-section 19C-19C in FIG. 19B. There may also be source/drain silicide regions (not shown) formed to connect lower source/drain regions 54L to backside interconnect structure 84.

The details of the backside interconnect structure 84 are not illustrated. The backside interconnect structure 84 also includes dielectric layers and a plurality of layers of conductive features in the dielectric layers. The conductive features may include contact plugs, conductive lines, and conductive vias, which may be formed using damascene processes. The dielectric layers and the conductive features may be formed using material and structures similar to that in front-side interconnect structure 72, and the details are not repeated herein.

FIGS. 19A, 19B, and 19C illustrate top (upper FET) 100U and bottom (lower FET) 100L, which collectively form the CFET. Upper FET 100U includes silicon fins 26', source/drain regions 54U, and gate stacks 66U. Lower FET 100L includes silicon fins 20', source/drain regions 54L, and gate stacks 66L. Throughout the description, protruding fins 20' are collectively referred to as a fin group, which may be a single-fin group (having only one fin) or a multi-fin group. Top fins 26' are collectively referred to as a fin group, which is a multi-fin group As shown in FIG. 19B, a bottom fin-cut process is performed in accordance with these embodiments, and some of bottom protruding fins 20' are cut. The top protruding fins 26', however, are not cut. Accordingly, the total count of top fins 26' is greater than the total count of bottom fins 20'. This may achieve the adjustment of the performance of the resulting CFET. For example, when the CFET is used for forming the pull-up and the pull-down transistors of a SRAM cell, the CFET with unequal top fin number and bottom fin number may be used for improving the write margin of the SRAM cell. For example, the pull-down transistor in the SRAM cell may have more fins than the pull-up transistors in the SRAM cell, which can be achieved through fin-cut processes.

The portion of dielectric layer 80 filling the recess formed by fin-cut is referred to as dielectric fin 81, In accordance with some embodiments, dielectric fin 81 has width W1 in the range between about 3 nm and about 10 nm, and height H1 in the range between about 10 nm and about 60 nm.

Figures 1, 20A:
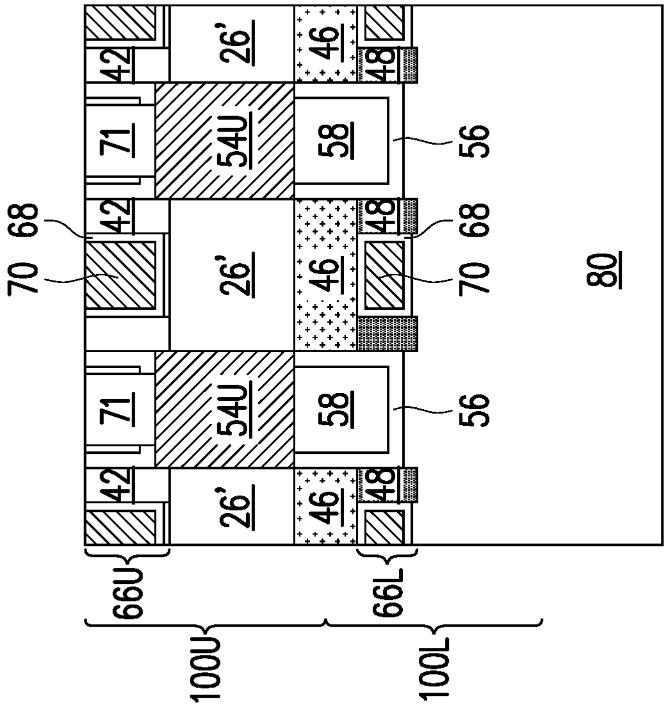
Figures 1, 20B:
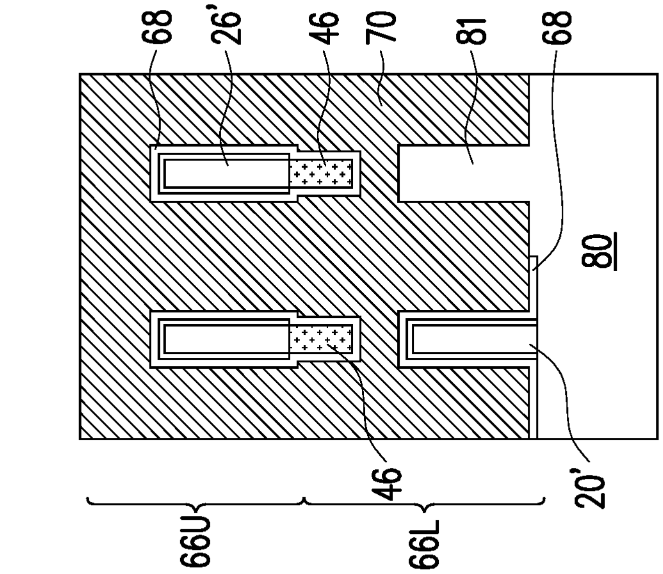
Figures 2, 20B:
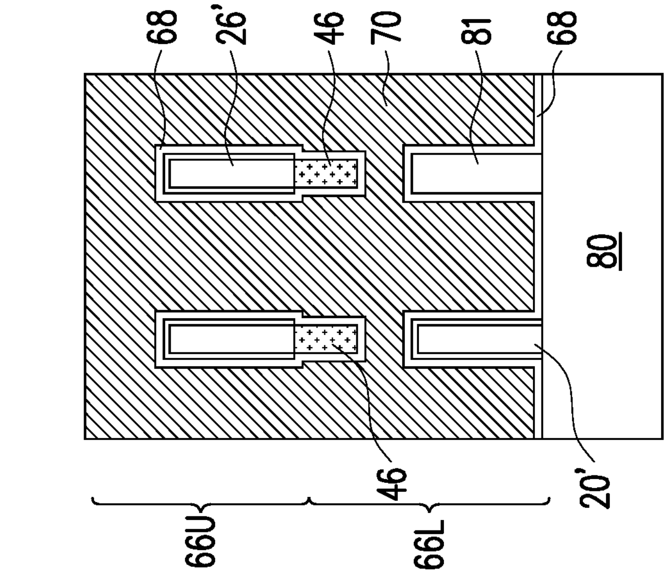
Figures 2, 20A:
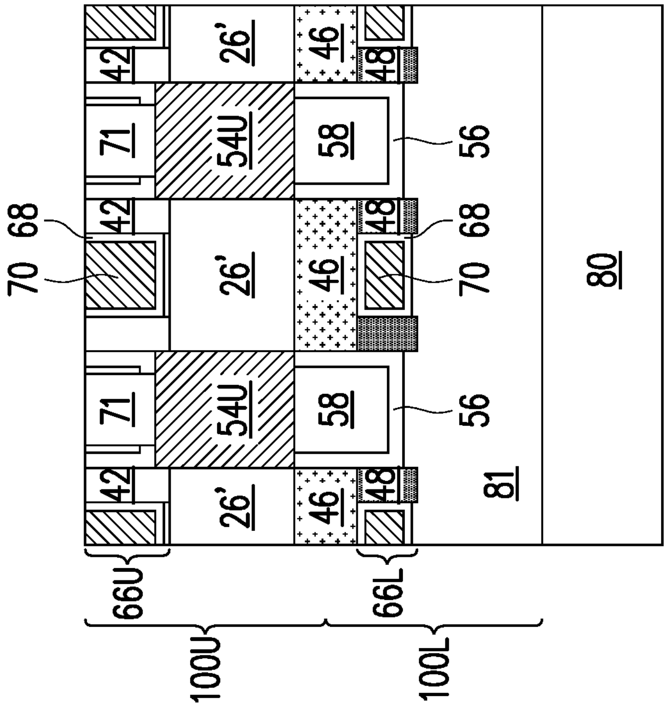

FIGS. 20A-1 and 20B-1 illustrate the CFET formed in accordance with alternative embodiments. These embodiments are similar to the embodiments shown in FIGS. 19A, 19B, and 19C, except that the gate dielectrics 68 as shown in FIG. 19B are also etched in the fin-cut process, and dielectric fin 81 is in physical contact with gate electrode 70.

FIGS. 20A-2 and 20B-2 illustrate the CFET formed in accordance with yet alternative embodiments. These embodiments are similar to the embodiments shown in FIGS. 19A, 19B, and 19C, except that the recess 78 formed by the fin-cut process are filled with dielectric fin 81 that is formed of a material different from the material of dielectric layer 80. The material of dielectric fin 81 may also be selected from the same group of candidate material for forming dielectric layer 80. The formation of dielectric fin 81 may include depositing a dielectric material, and performing a planarization process to remove excess portions of the dielectric material.

The preceding embodiments adopt a bottom fin-cut process in the monolithic formation of a CFET. FIG. 21 through FIGS. 35A, 35B, and 35C illustrate a top fin-cut process in the monolithic formation of a CFET in accordance with alternative embodiments. Unless specified otherwise, the materials, the structures, and the formation processes of the components in these embodiments are essentially the same as the like components denoted by like reference numerals in the preceding embodiments. The details regarding the materials, the structures, and the formation processes of the components shown in these embodiments and subsequent embodiments may thus be found in the discussion of the preceding embodiments.

Figure 21:
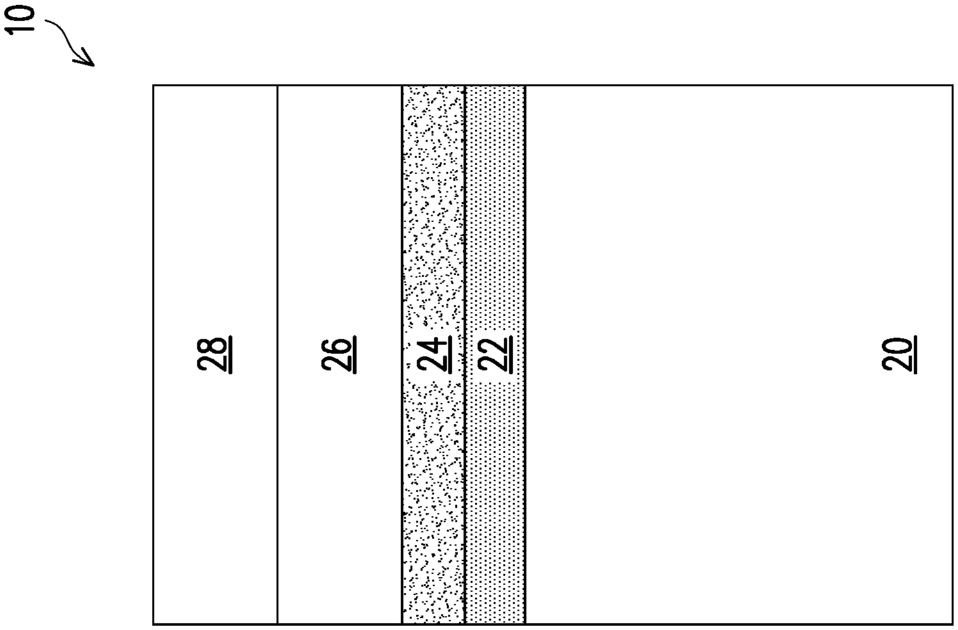
Figure 22B:
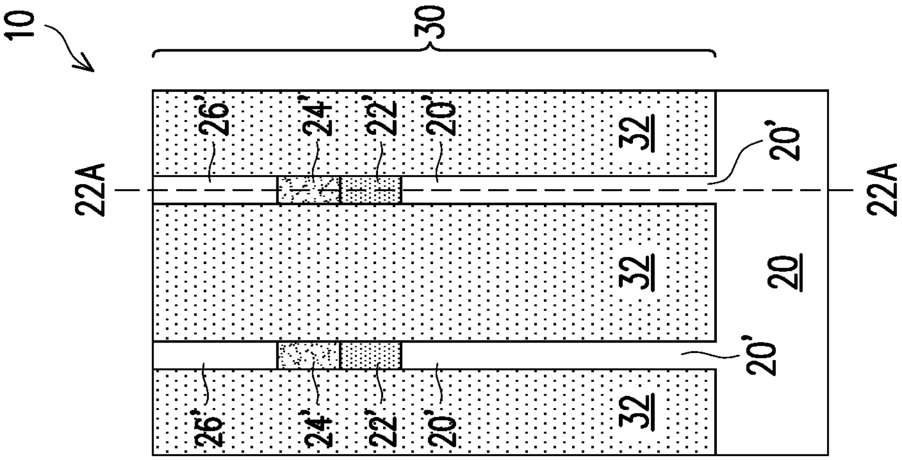
Figure 22A:
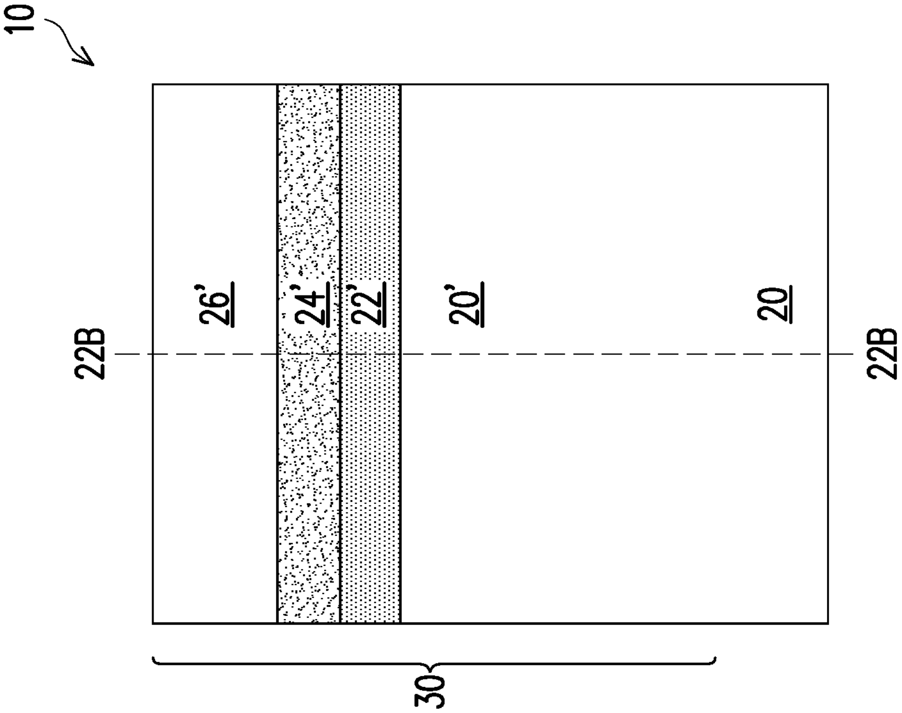

FIG. 21 illustrates the formation of wafer 10. The details are essentially the same as discussed referring to FIG. 1. Next, as shown in FIGS. 22A and 22B, wafer 10 is etched to form strips 30, and STI regions 32 are also formed. Silicon fins 26' are exposed through STI regions 32. Again, FIG. 22A illustrates the cross-section 22A-22A in FIG. 22B, and FIG. 22B illustrates the cross-section 22B-22B in FIG. 22A.

Figure 23B:
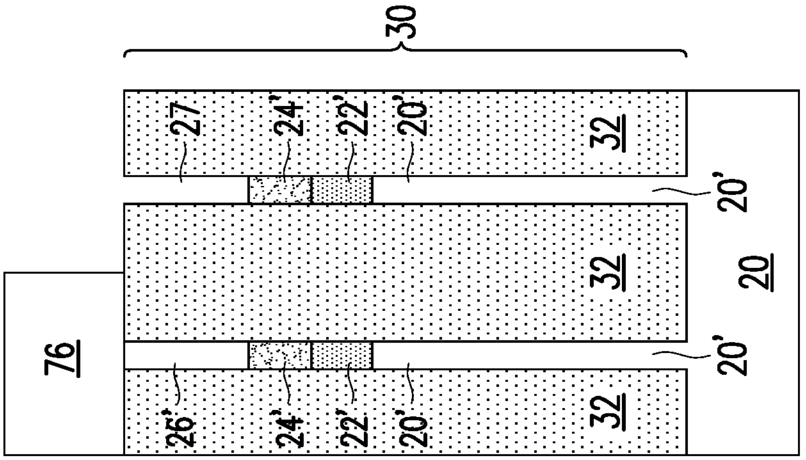
Figure 23A:
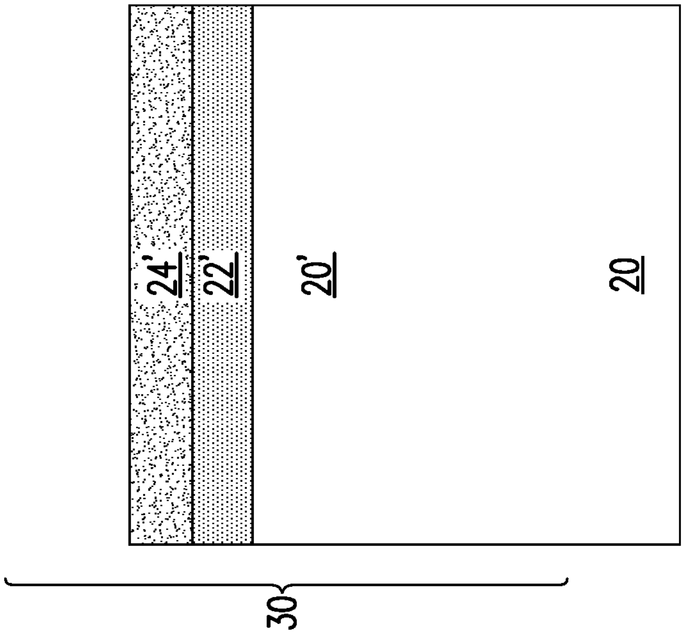

Next, referring to FIGS. 23A and 23B, etching mask 76, which may comprise a photoresist, is formed and patterned to cover at least one, or more, of the protruding fins 30', while leaving at least one or more of the strips 30 not covered. The exposed silicon fin(s) 26' are then removed in an etching process to form recess(es) 27. The etching is selective, so that sacrificial strips 24' are not etched.

Figure 24B:
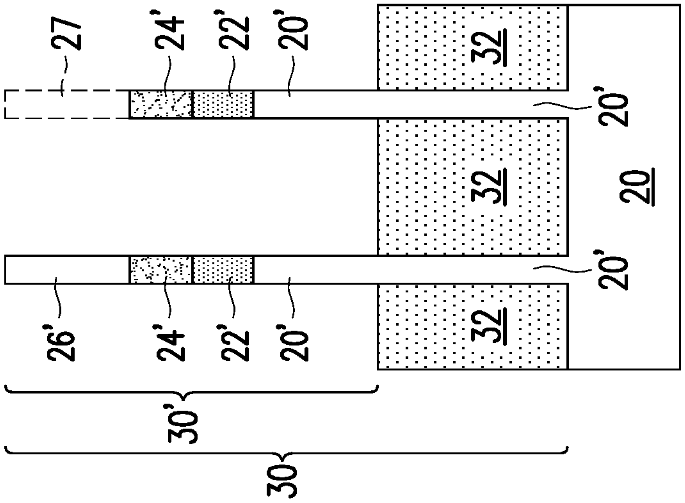
Figure 24A:
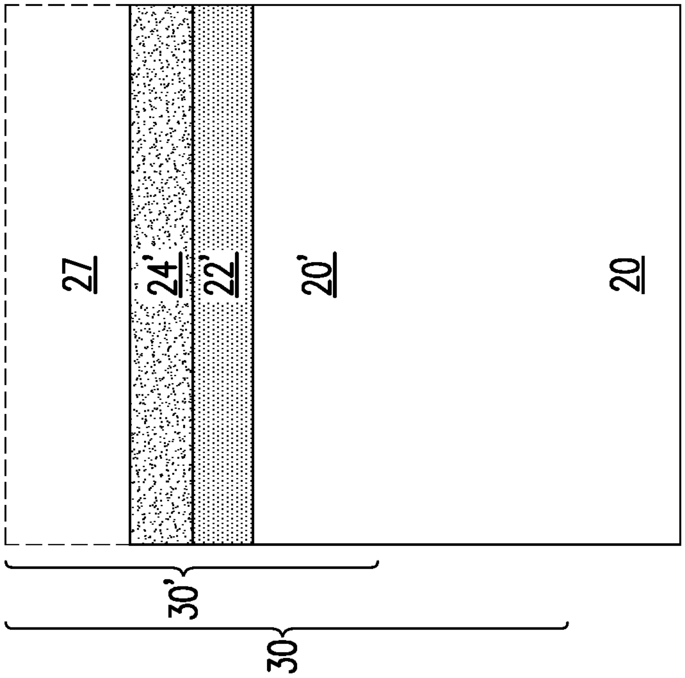

FIGS. 24A and 24B illustrate the recessing of STI regions 32, which are recessed to a level lower than the bottom surfaces sacrificial strips 22'. Some portions of silicon fins 20' protrude higher than the top surfaces of STI regions 32 to form protruding fins 20'.

Figure 25A:
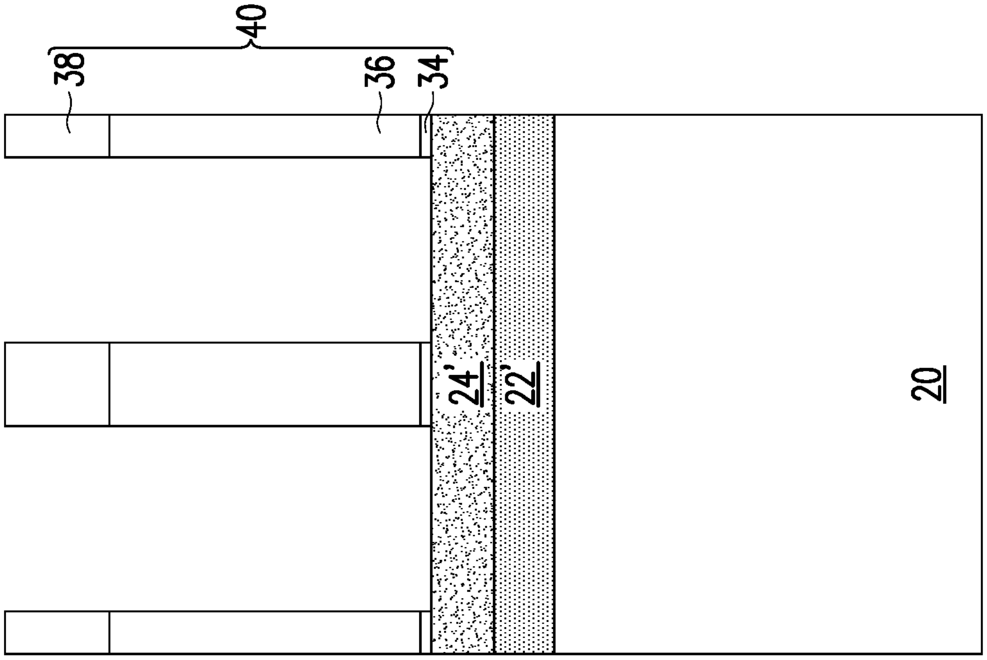
Figure 25B:
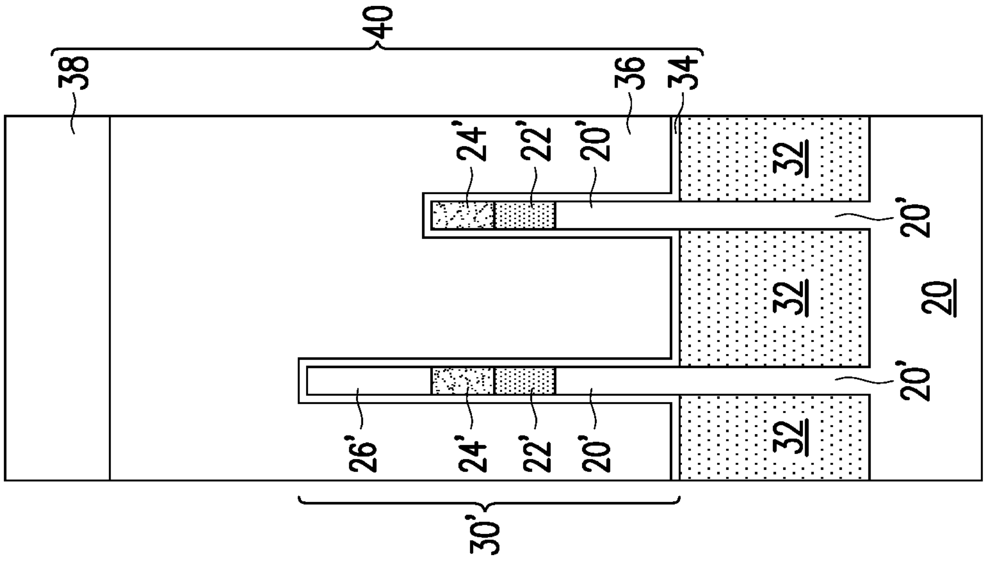

FIGS. 25A and 25B illustrate the formation of gate stacks 40, which include dummy gate dielectrics 34, dummy gate electrodes 36, and hard mask layers 38.

Figure 26B:
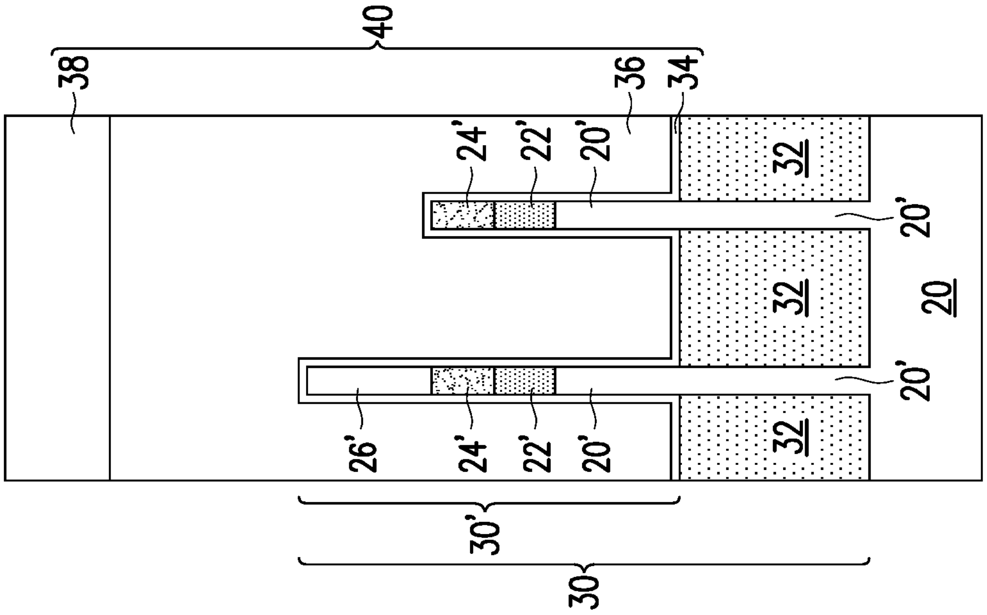
Figure 26A:
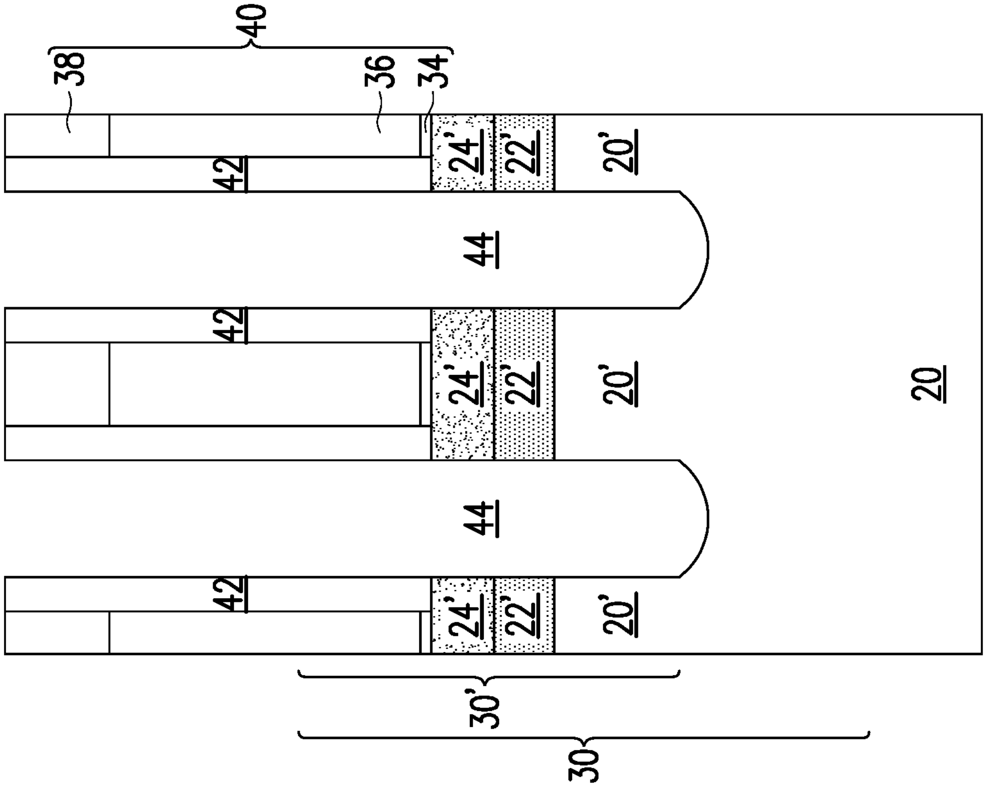

Next, as shown in FIGS. 26A and 26B, gate spacers 42 are formed on the sidewalls of dummy gate stacks 40. A recessing process is then performed to etch the portions of protruding fins 30', forming recesses 44.

Figure 27B:
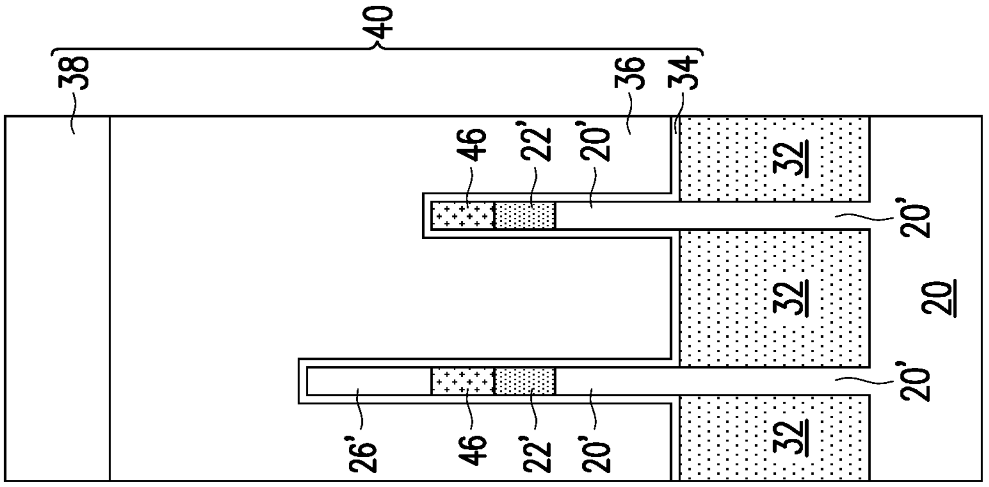
Figure 27A:
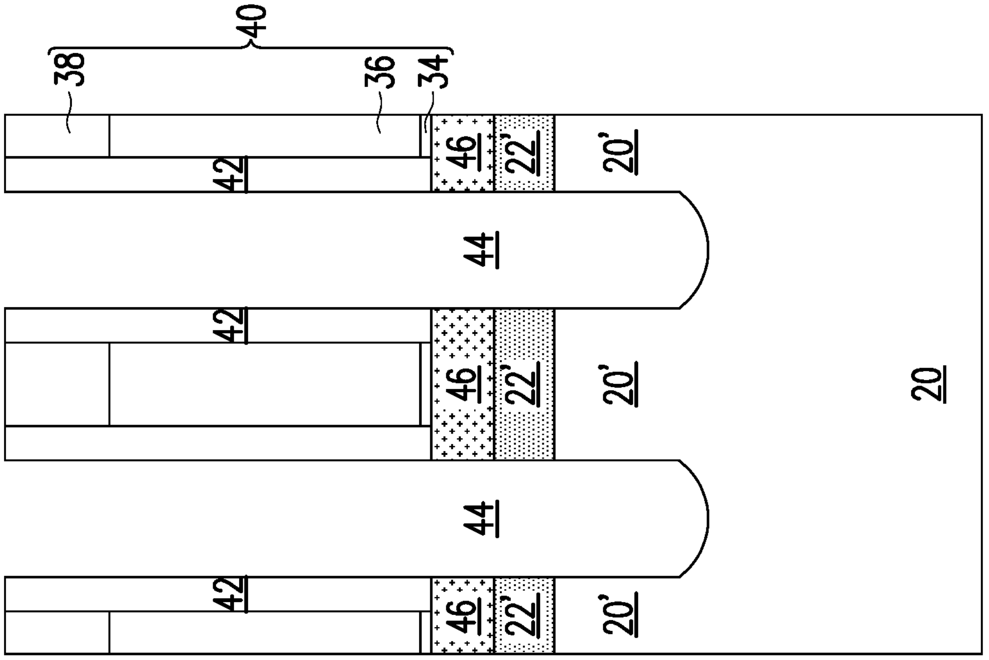
Figure 28B:
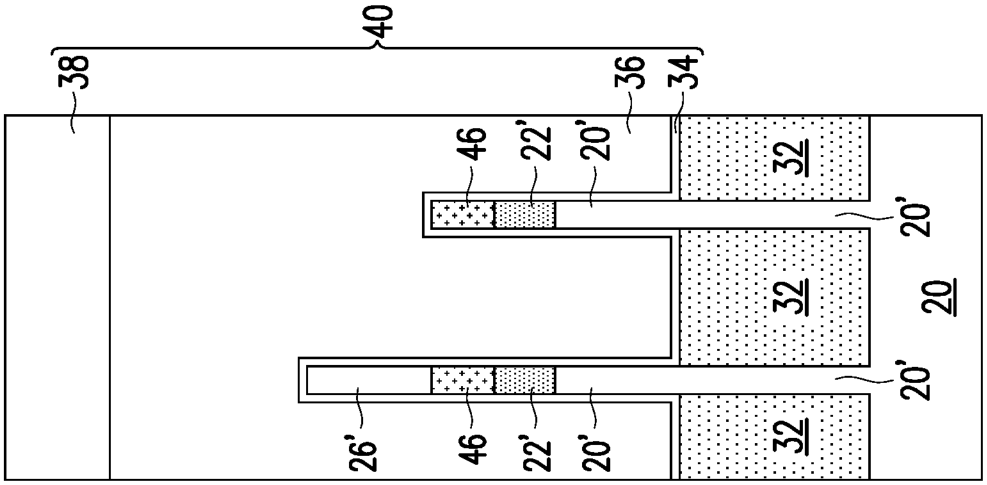
Figure 28A:
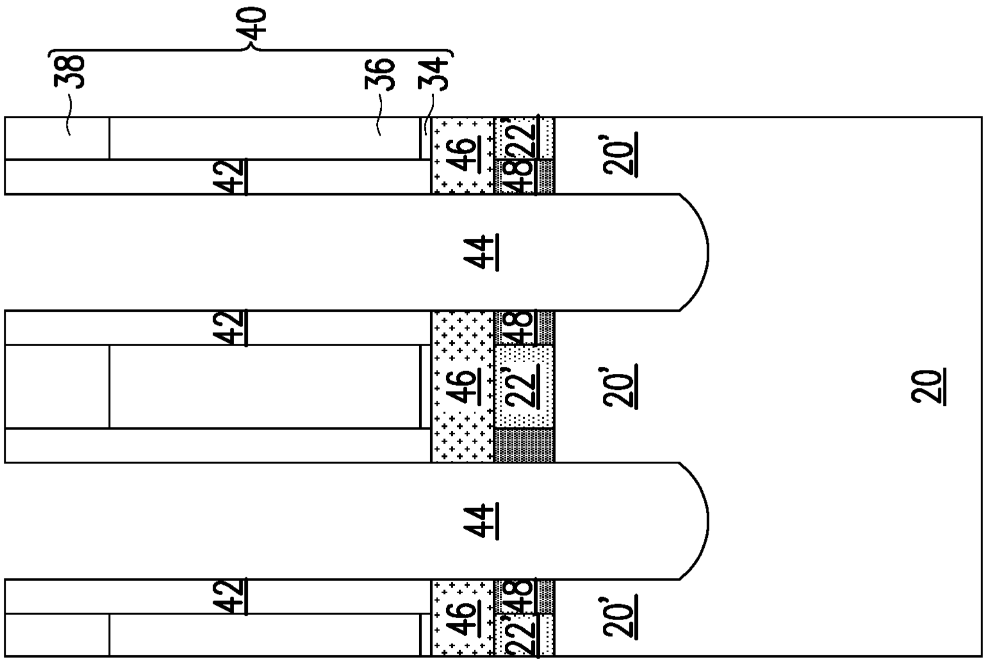
Figure 29A:
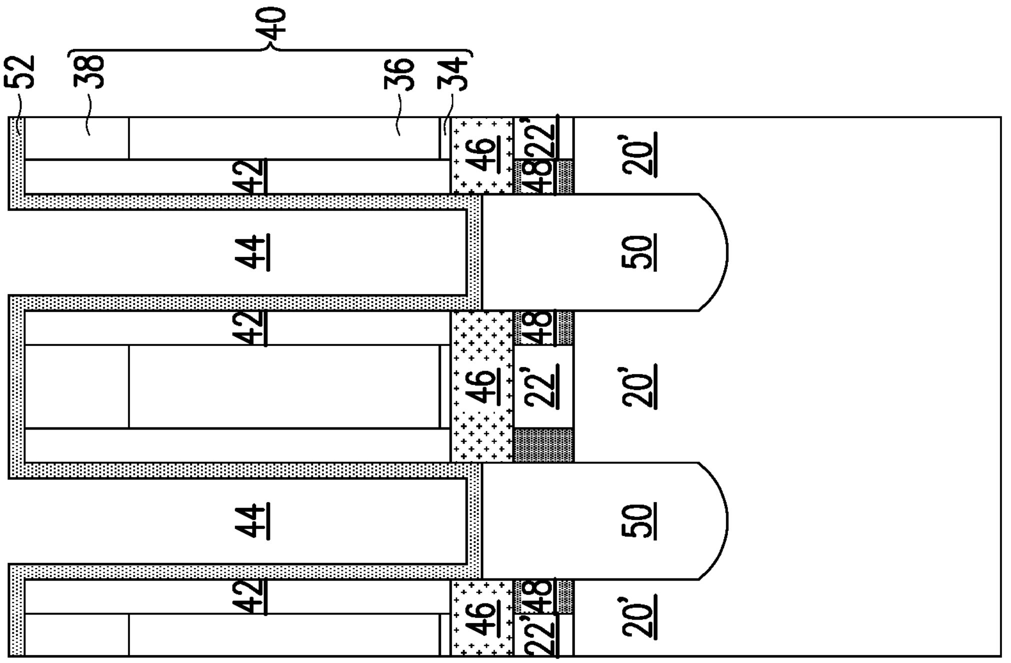
Figure 29B:
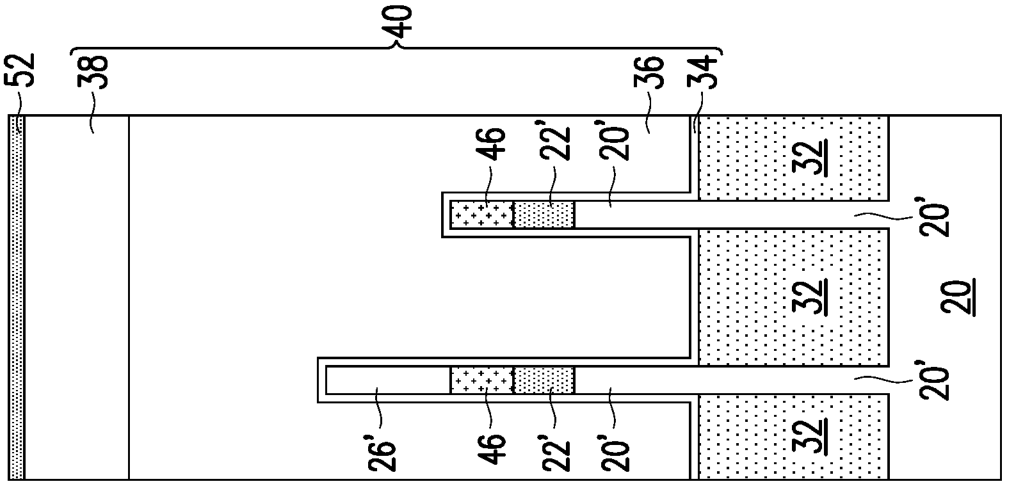

Next, sacrificial strips 24' are replaced with middle dielectric layers 46, as shown in FIGS. 27A and 27B. FIGS. 28A and 28B illustrate the formation of inner spacers 48. In FIGS. 29A and 29B, sacrificial regions 50 are formed in the lower portions of the recesses 44. Dummy isolation layer 52 is then deposited as a conformal layer and extending into recesses 44.

Figure 30C:
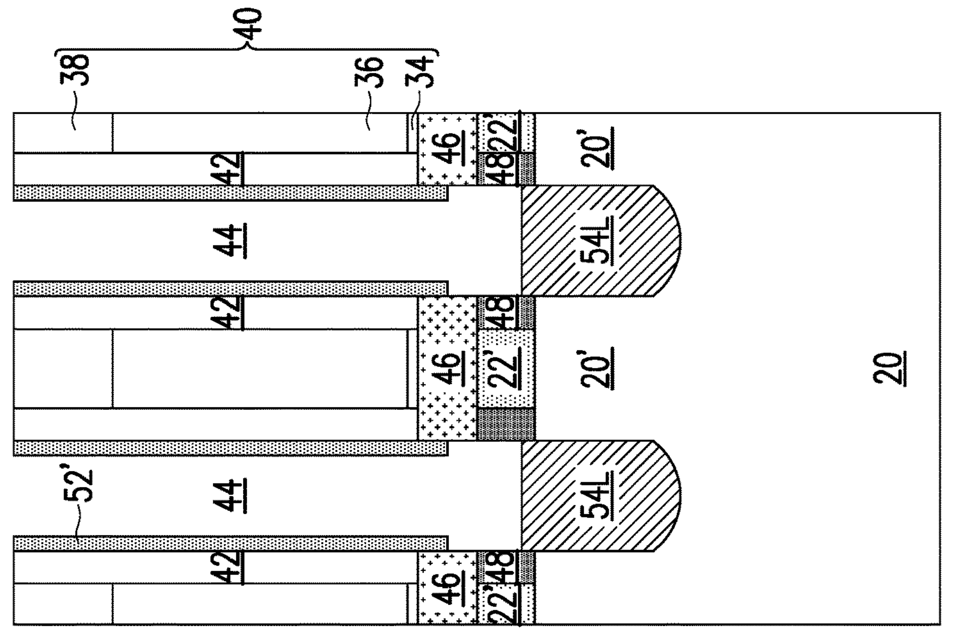
Figure 30B:
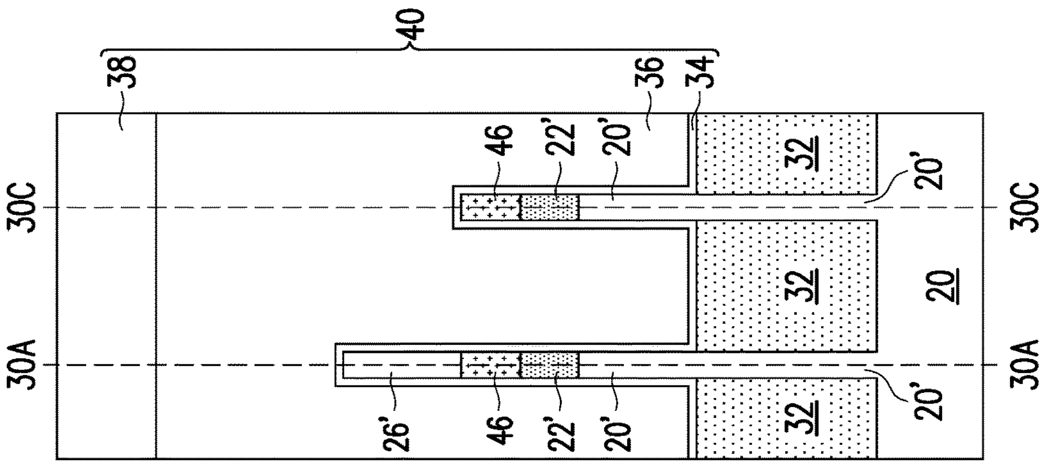
Figure 30A:
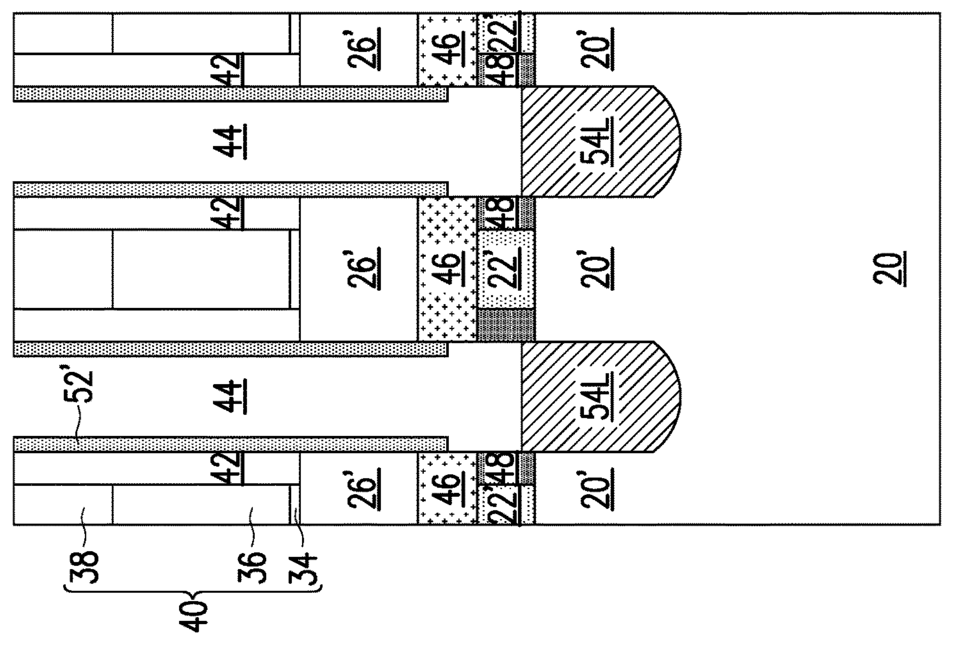

Dummy isolation layer 52 is then etched in an anisotropic etching process, forming the dummy spacers 52' as shown in FIGS. 30A and 30C. FIGS. 30A and 30C illustrate the cross-sections 30A-30A and 30C-30C, respectively in FIG. 30B. In subsequent FIGS. 31A, 31B, 31C through FIGS. 35A, 35B, 35C, the figures whose numbers including letters "A," "B," and "C" are also obtained from the same cross-sections as shown in FIGS. 30A, 30B, and 30C, respectively.

Figure 31C:
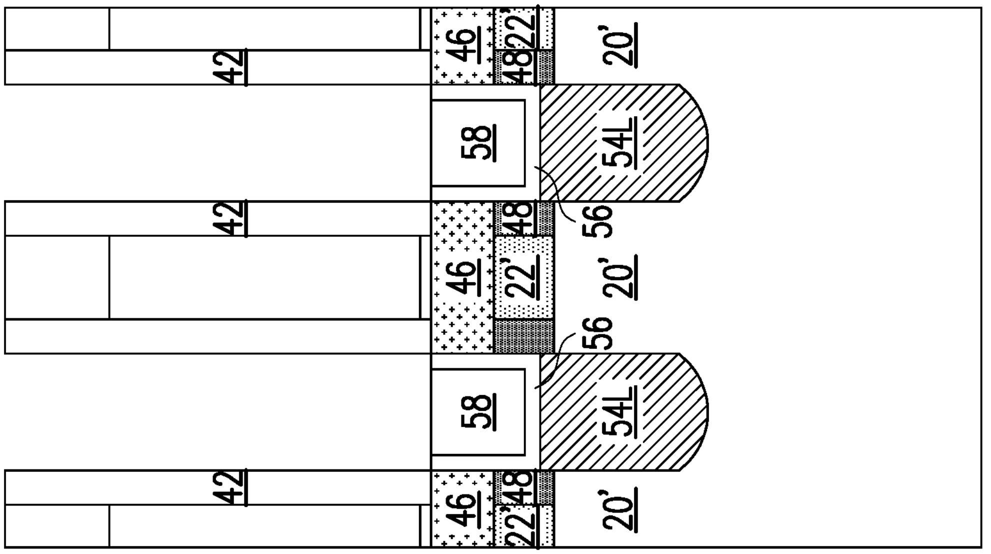
Figure 31B:
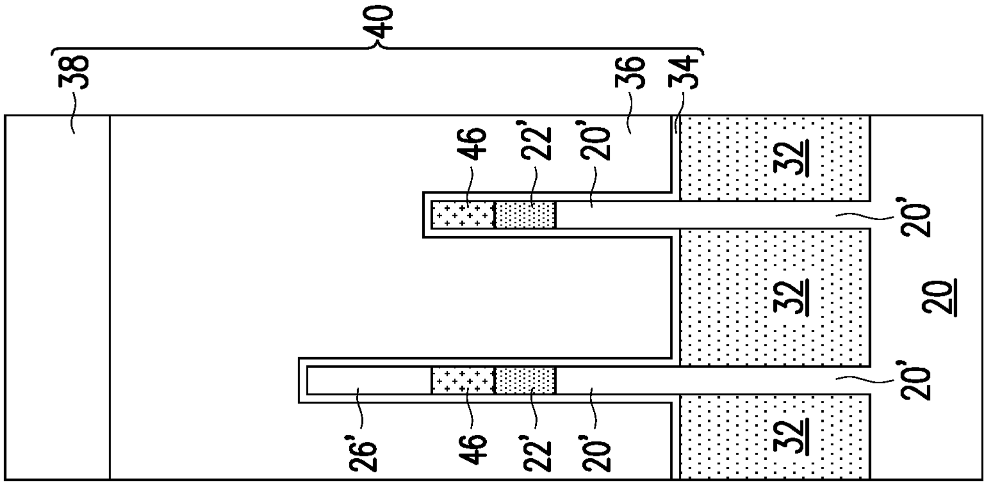
Figure 31A:
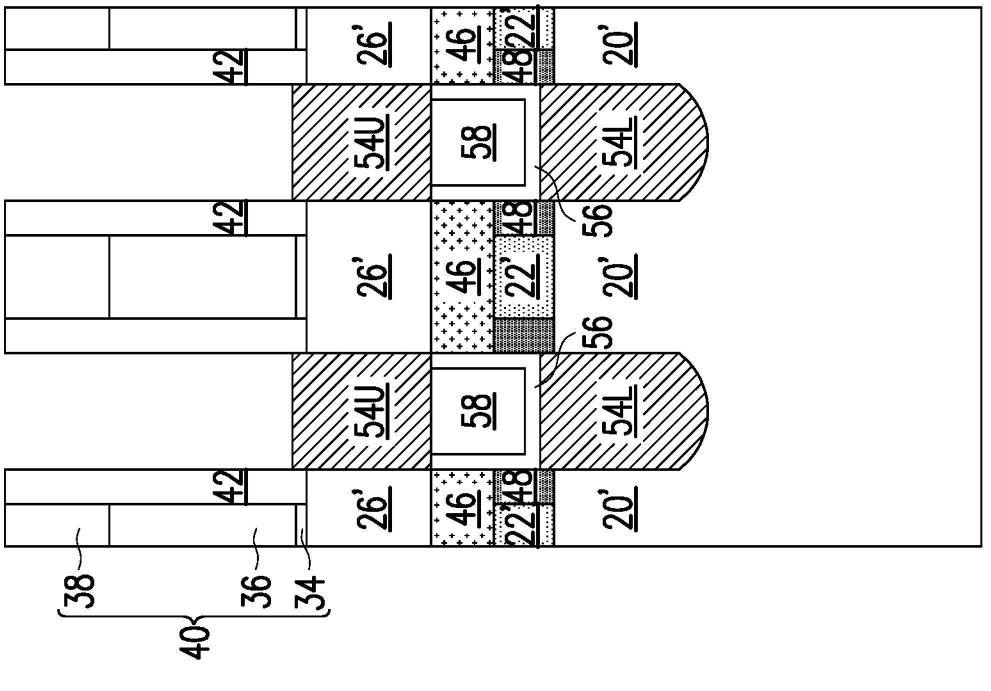

The sacrificial regions 50 are then removed from the recesses 44, for example, through a dry etch process, a wet etch process, the like, or a combination thereof. The resulting structure is shown in FIGS. 31A, 31B, 31C. The etching may be isotropic. The etching is selective to dummy spacers 52'. Removing the sacrificial regions 50 exposes the sidewalls of silicon fins 20'.

Lower epitaxial source/drain regions 54L are then formed through epitaxy in the lower portions of the recesses 44. The lower epitaxial source/drain regions 54L are in contact with silicon fins 20' and are not in contact with the silicon fins 26'. Inner spacers 48 electrically insulate the lower epitaxial source/drain regions 54L from the sacrificial layers 22'. Dummy spacers 52' are then removed from the recesses 44, for example, through an isotropic etching process, so that the sidewalls of silicon fins 26' are exposed.

Further referring to FIGS. 31A, 31B, and 31C, the first CESL 56 and the first ILD 58 are formed. Upper epitaxial source/drain regions 54U are then formed in the upper portions of the recesses 44.

Figures 32A, 32B, 32C:
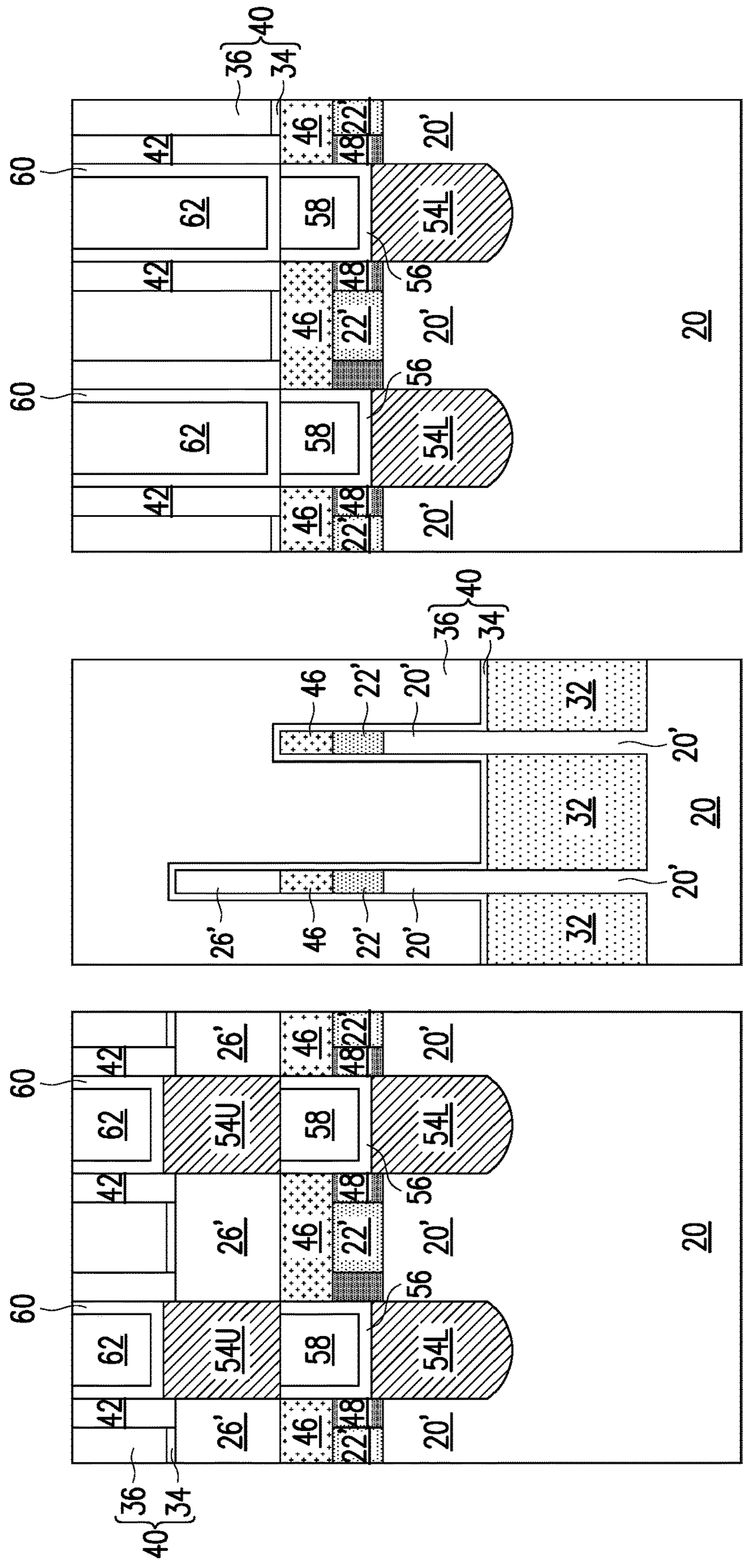

In FIGS. 32A, 32B, and 32C, the second CESL 60 and the second ILD 62 are formed. The formation process may include depositing the layers for CESL 60 and ILD 62, and performing a planarization process to remove the excess portion of the corresponding layers. After the planarization process, the top surfaces of the second ILD 62, the gate spacers 42, and the dummy gate stacks 40 are coplanar.

Figure 33C:
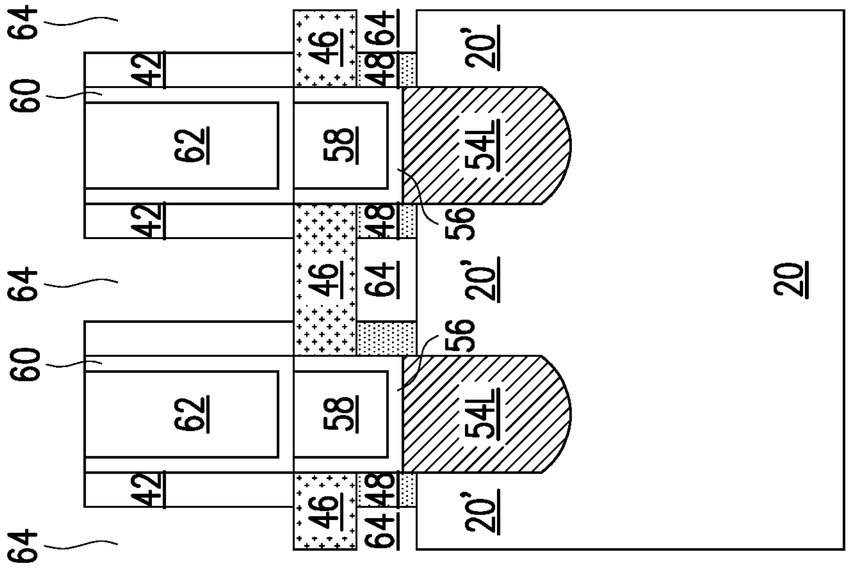
Figure 33B:
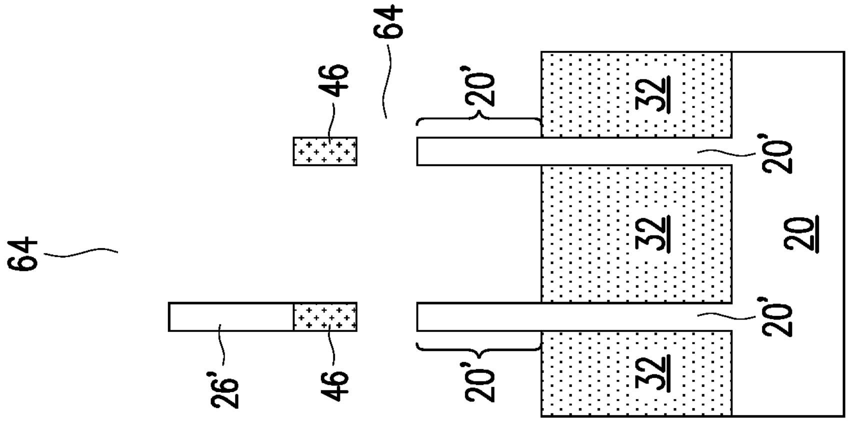
Figure 33A:
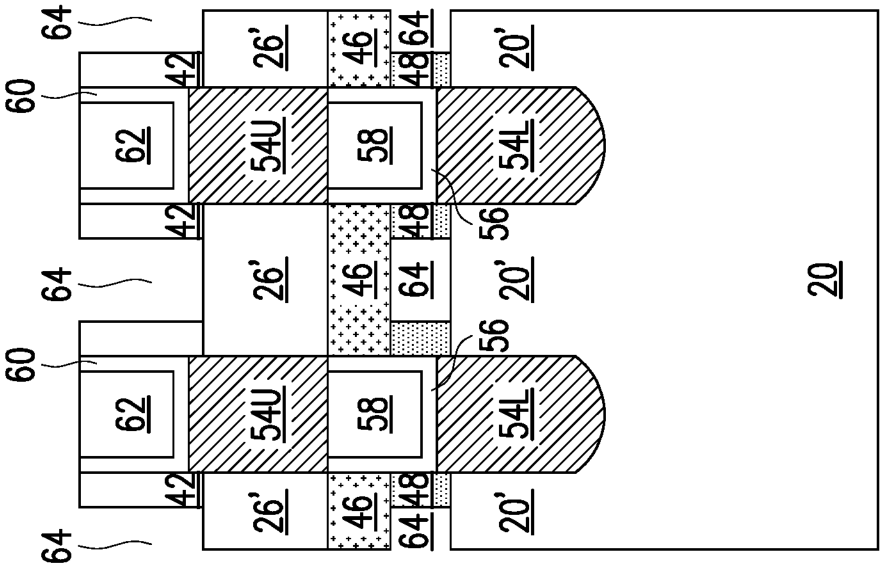

Next, the dummy gate stacks 40 are removed in one or more etching processes, so that recesses 64 are formed, as shown in FIGS. 33A, 33B, and 33C. Silicon fins 26' and 20' are exposed to recesses 64. Throughout the description, silicon fins 26' and 20' are also alternatively referred to as (protruding) fins 26' and 20', respectively.

Figures 34A, 34B, 34C:
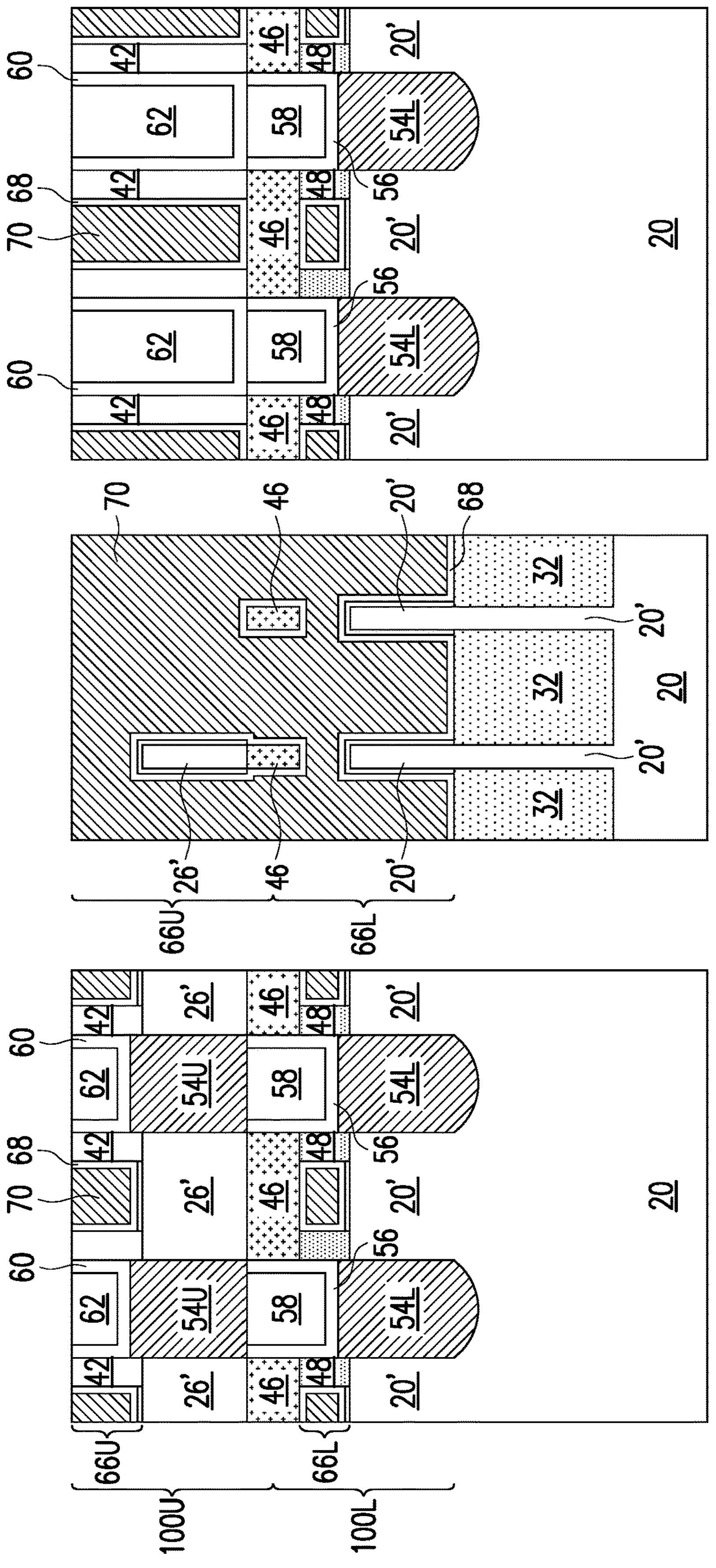
Figure 35C:
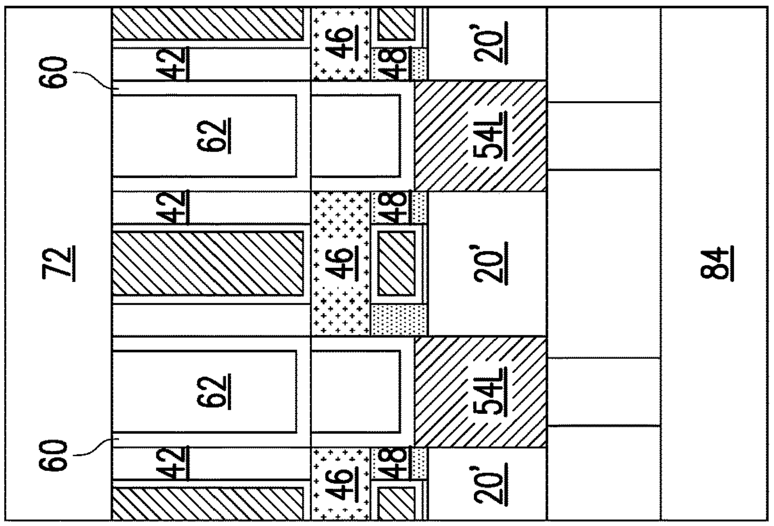
Figure 35B:
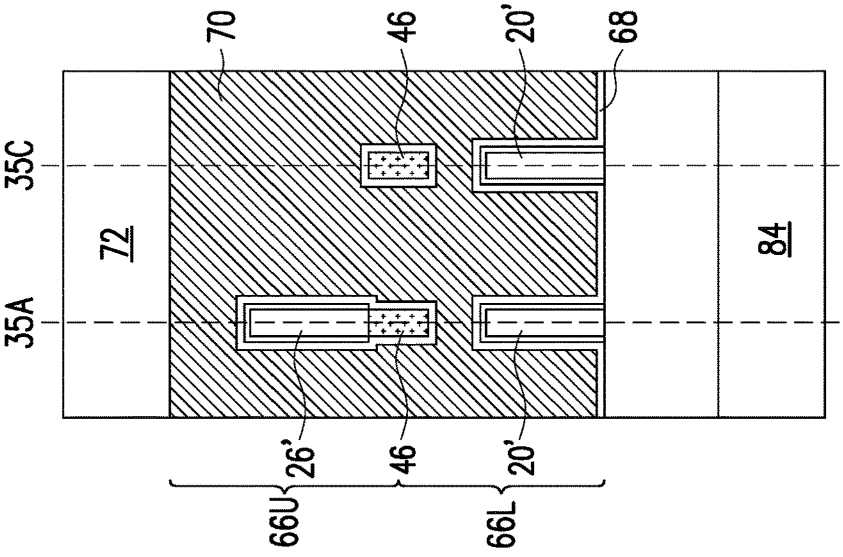
Figure 35A:
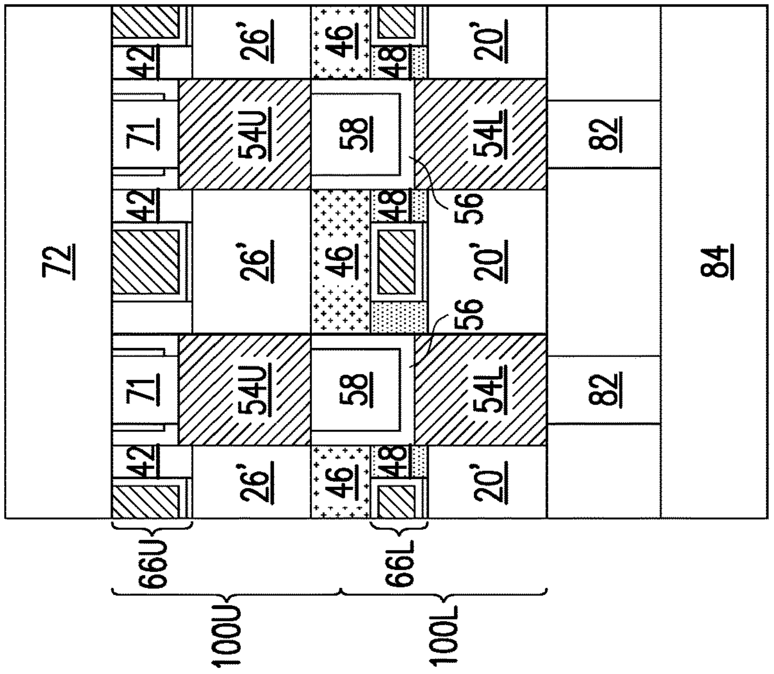

FIGS. 34A, 34B, and 34C illustrate the formation of replacement gate stacks 66 (including 66U and 66L), which include gate dielectrics 68 and gate electrodes 70. FIGS. 35A, 35B, and 35C illustrate the formation of contact plugs 71, front-side interconnect structure 72, contact plugs 82, and backside interconnect structure 84. Again, FIG. 35A illustrates the cross-section 35A-35A in FIG. 35B, and FIG. 35C illustrates the cross-section 35C-35C in FIG. 35B. There may also be source/drain silicide regions (not shown) formed to connect lower source/drain regions 54L to contact plugs 82, and upper source/drain regions 54U to contact plugs 71.

Figure 36C:
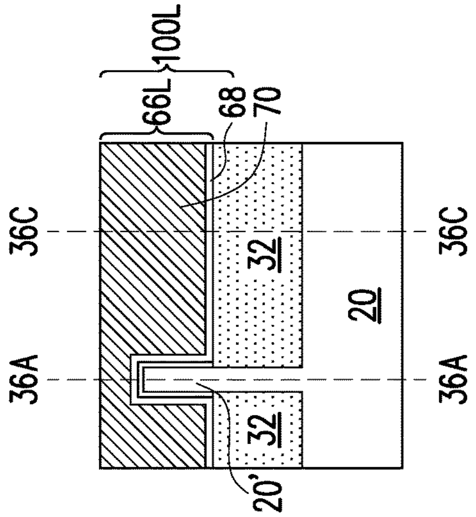
Figure 36B:
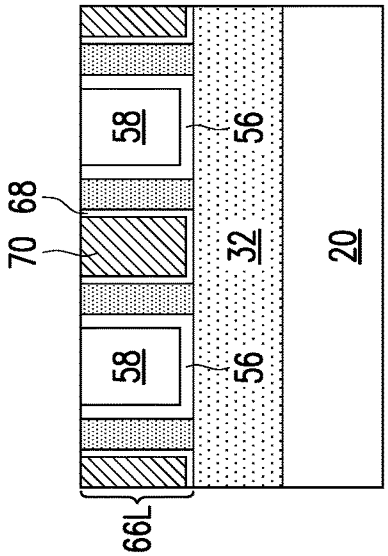
Figure 36A:
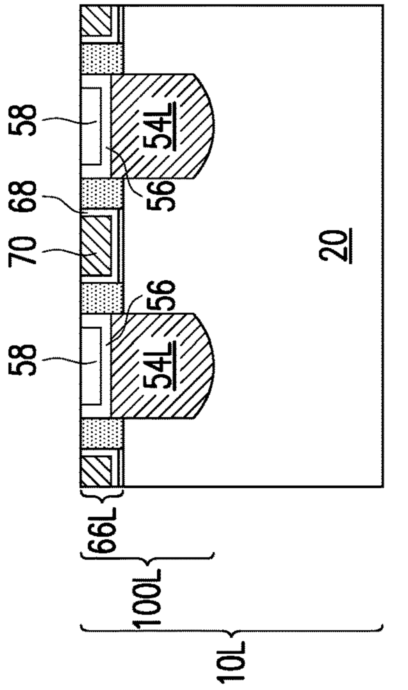

FIGS. 36A, 36B, and 36C through FIGS. 43A, 43B, and 43C illustrate the formation of a CFET through a sequential process, wherein from lower portions to the upper portions of the CFETs, the features of the CFET are formed sequentially. Again, the details of the like components in accordance with these embodiments may be found from the preceding embodiments, and may not discussed in detail herein. FIG. 36A illustrates the cross-section 36A-36A in FIG. 36C, and FIG. 36B illustrates the cross-section 36B-36B in FIG. 36C. The subsequent figures whose numbers including letters "A," "B," and "C" are also obtained from the same cross-sections as shown in FIGS. 36A, 36B, and 36C, respectively.

Referring to FIGS. 36A, 36B, and 36C, lower wafer 10L is formed, in which lower FinFET 100L is formed. Lower FinFET 100L includes source/drain regions 54L and gate stack 66L, which are formed in CESL 56 and ILD 58. FinFET 100L includes a first semiconductor fin(s), which has a first count. For example, in the illustrated example, the first count is 1, while the first count may also be 2, 3, 4, or any greater number.

Figures 37A, 37B, 37C:
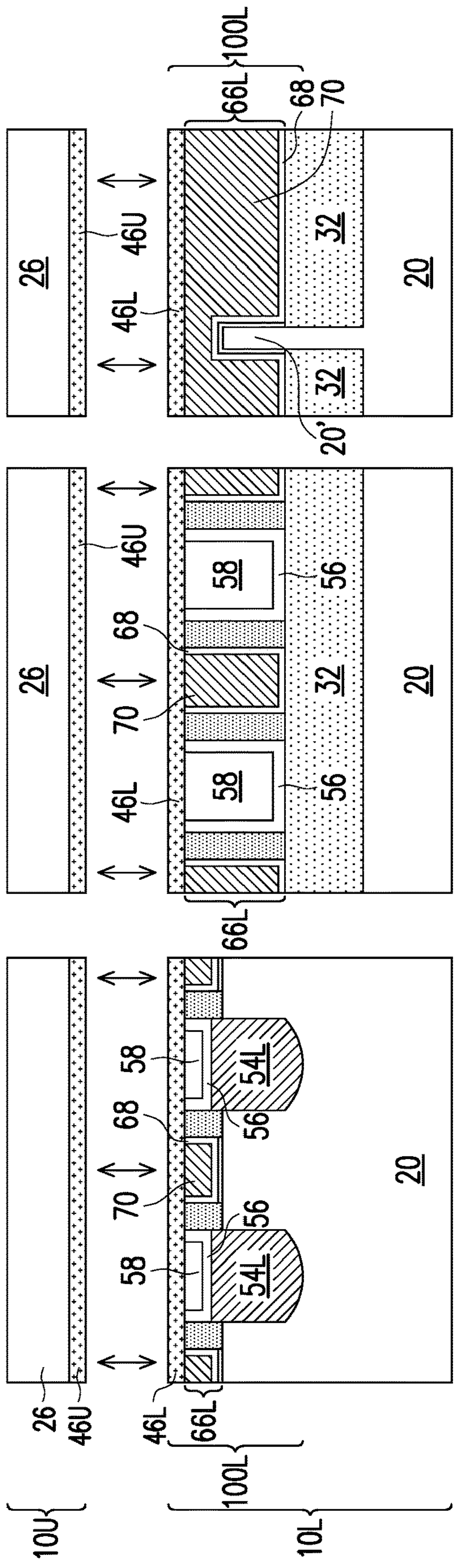

Referring to FIGS. 37A, 37B, and 37C, bond layer 46L is formed, for example, through a deposition process such as an ALD process, a CVD process, or the like. Bond layer 46L may be formed of or comprise a silicon-containing dielectric material such as $SiO_2$. SiN, SiC, SION, SiCN, SiOC, SiOCN, or the like.

Upper wafer 10U is also formed. Upper wafer 10U may include bond layer 46U and semiconductor layer 26. Semiconductor layer 26 may be a crystalline silicon layer, which may be free from germanium, or may include silicon germanium. The material of bond layer 46U may be selected from $SiO_2$, SiN, SiC. SION, SiCN, SiOC, SiOCN, and may be the same as, or different from, the material of bond layer 46L. The bonding of bond layer 46U to bond layer 46L may be through fusion bonding. Bond layers 46L and 46U, after being bonded, collectively form middle dielectric layers 46.

Figures 38A, 38B, 38C:
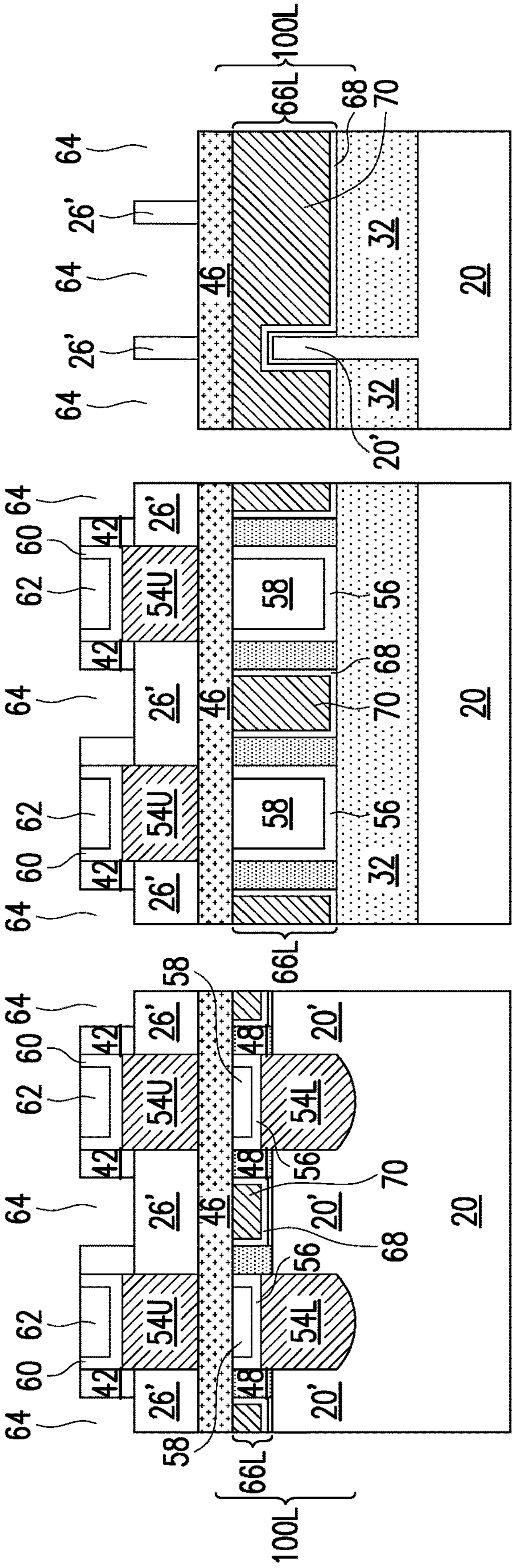

FIGS. 38A, 38B, and 38C illustrate the structure formed after a plurality of processes. First, the semiconductor layer 26 as shown in 37A, 37B, and 37C are patterned to form a plurality of semiconductor fins 26', which protrude higher than middle dielectric layers 46. Semiconductor fins 26' are also referred to as silicon fins 26', while they may be formed of other semiconductor materials such as silicon germanium, carbon-doped silicon, or the like. The resulting FinFET 100U (FIGS. 42A, 42B, and 42C) includes second semiconductor fins 26', which has a second count different from the first semiconductor fins 20', as the channels. For example, in the illustrated example, the second count may also be 2, 3, 4, or any greater number. The second count may be greater than, or may be smaller than, the first count of first semiconductor fins 20'. In addition, semiconductor fins 26' may be vertically aligned to or vertically misaligned from the respective underlying semiconductor fins 20'.

Dummy gate stacks (not shown, similar to gate stack 40 in FIGS. 5A and 5B) and gate spacers 42 are formed. The silicon fins 26' are etched using the dummy gate stacks and gate spacers 42 as an etching mask, forming recesses between neighboring remaining portions of silicon fins 26'. Upper source/drain regions 54U, CESL 60, and ILD 62 are then formed. The dummy gate stacks are then removed to form recesses 64, through which silicon fins 26' are exposed, as shown in FIGS. 38A, 38B, and 38C.

Figure 39C:
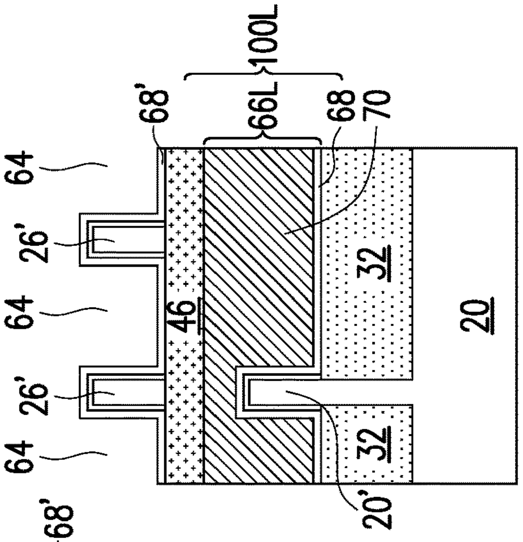
Figure 39B:
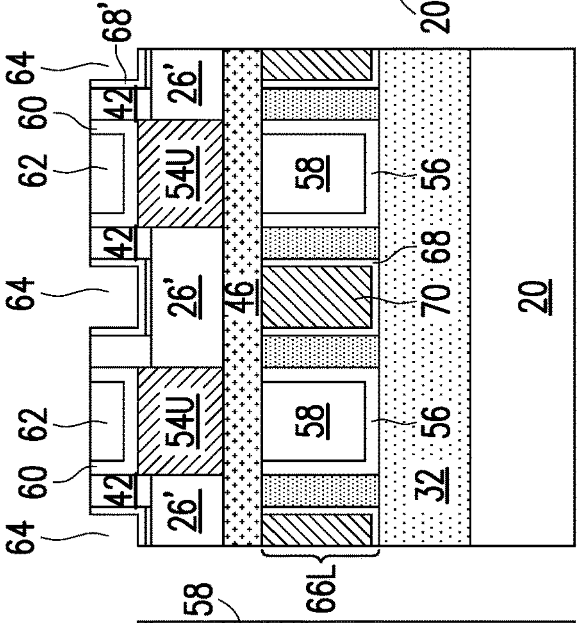
Figure 39A:
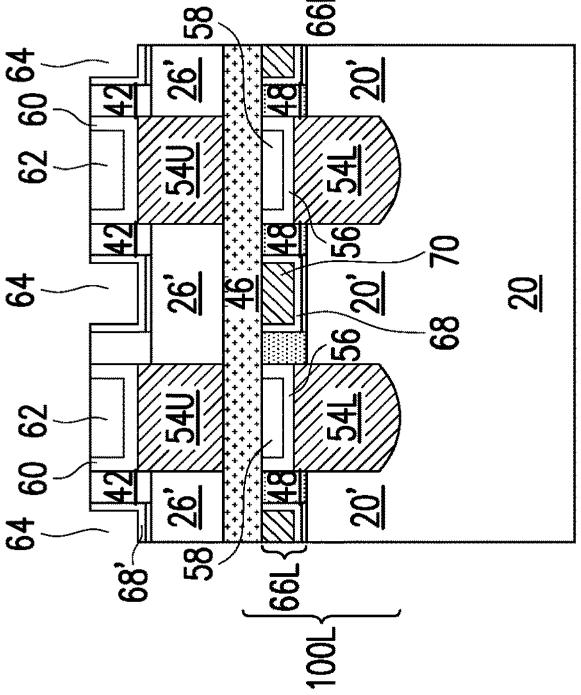
Figures 40A, 40B, 40C:
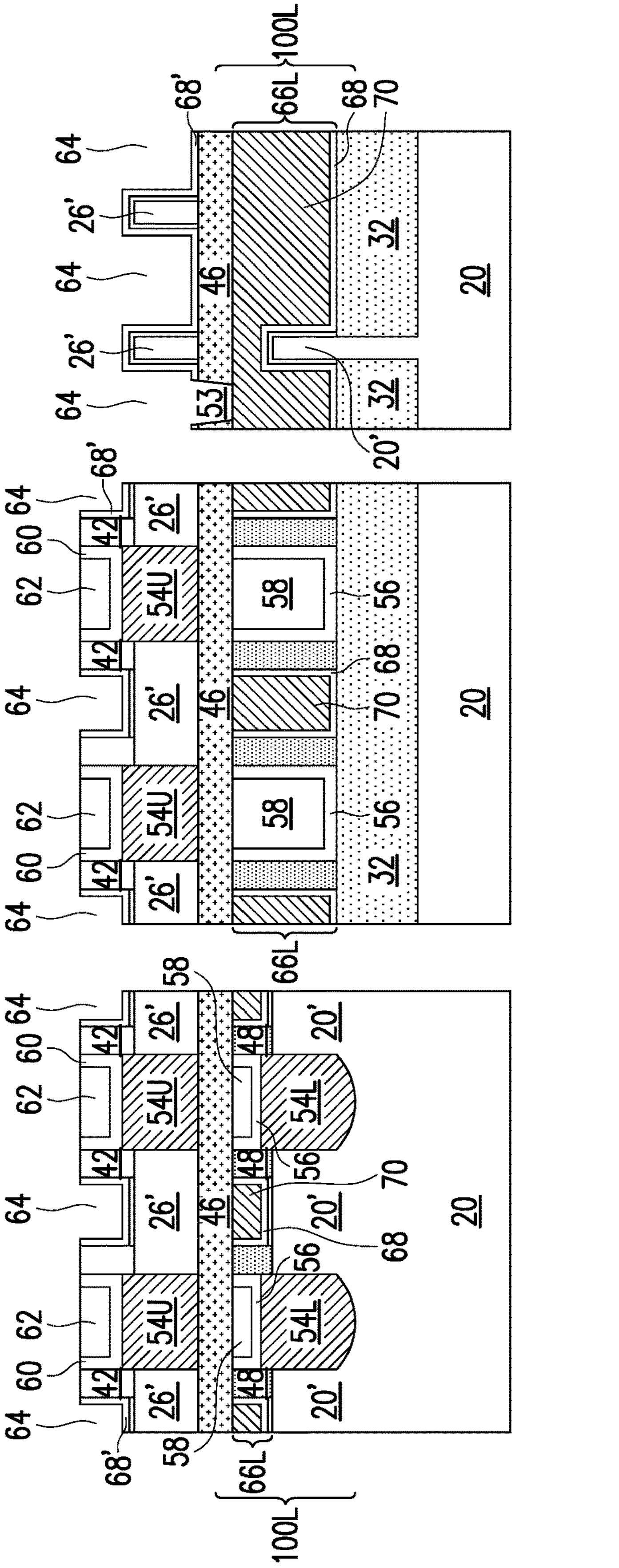

In a subsequent process, as shown in FIGS. 39A, 39B, 39C, gate dielectrics 68' are formed. Gate dielectrics 68' may include interfacial layers and high-k dielectric layers. Next, as shown in FIGS. 40A, 40B, and 40C, gate dielectrics 68' and middle dielectric layer 46 are etched to form gate via opening 53, wherein the gate electrode 70 in the lower gate stack 66L is exposed.

Figures 41A, 41B, 41C:
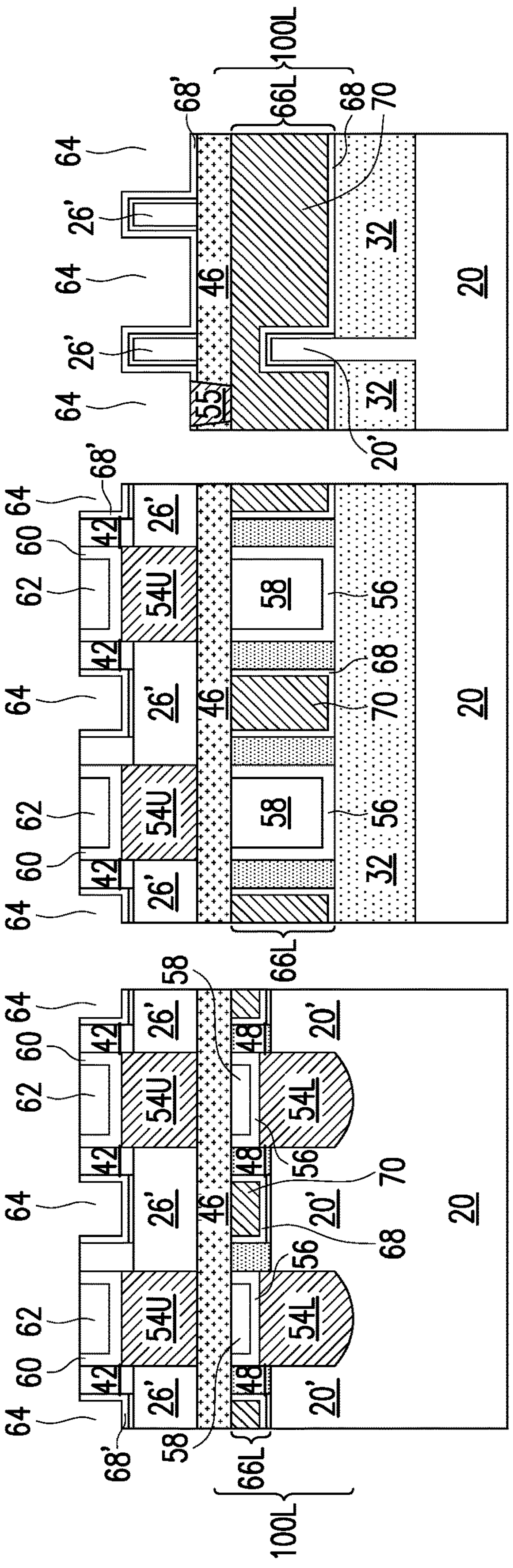

In a subsequent process, as shown in FIGS. 41A, 41B, and 41C, gate via 55 is formed. The formation process may include selectively depositing a metallic material on the exposed gate electrode 70, wherein the metallic material is not deposited on the exposed dielectric materials. Gate via 55 may be formed of or comprise a metal selected from W, Ru, Mo, Co, Cu, Ti, Ta, TiN, TaN, or the like, combinations thereof, and multi-layers thereof.

Figure 42C:
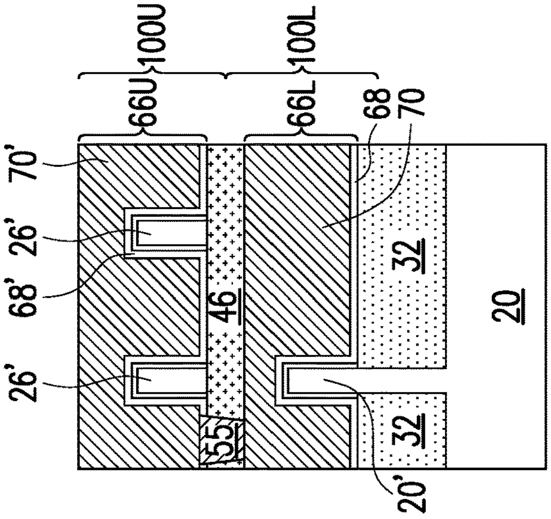
Figure 42B:
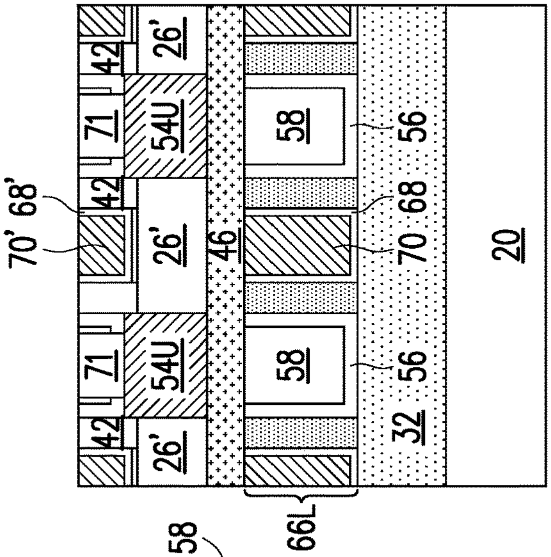
Figure 42A:
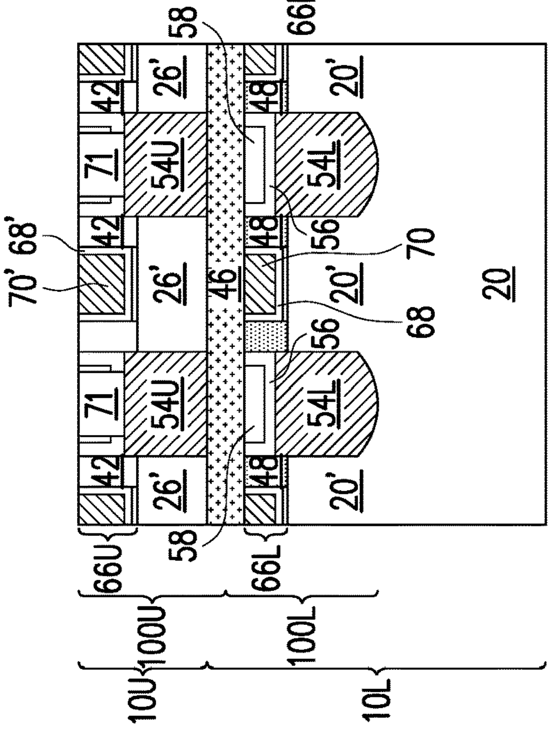

Referring to FIGS. 42A, 42B, and 42C, gate electrode 70' is formed. The material of gate electrode 70' is selected from the same group of candidate materials as for gate electrode 70, as discussed in preceding paragraphs, and is selected according to the conductivity type of the corresponding upper FinFET. Gate electrode 70' is electrically connected to gate electrode 70 through gate via 55. Gate electrode 70' and gate dielectrics 68' collectively form upper gate stacks 66U. Upper FinFET 100U is thus formed, which includes source/drain regions 54U and gate stack 66U, which are in CESL 60 and ILD 62.

Figures 43A, 43B, 43C:
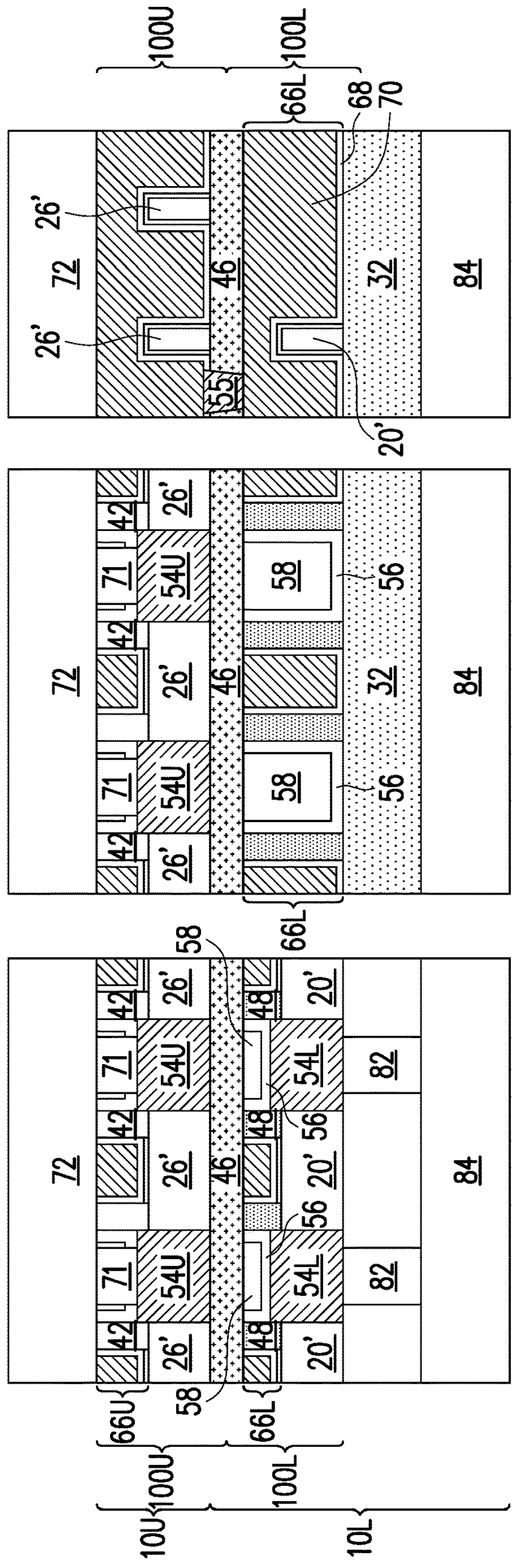

Referring to FIGS. 43A, 43B, and 43C, in subsequent processes, gate contact plugs 71 and front-side interconnect structure 72 are formed. A backside grinding process is the performed to thin lower wafer 10L. Gate contact plugs 82 and backside interconnect structure 84 are then formed.

In the CFET as shown in FIGS. 43A, 43B, and 43C, the number of bottom fins is smaller than the number of top fins. In accordance with alternative embodiments, the number of bottom fins may be greater than the number of top fins. The corresponding processes are essentially the same as illustrated and discussed, except when patterning the semiconductor layer 26 as shown in FIG. 37C, the number of fins 26' is smaller than the number of fins 20'.

The embodiments of the present disclosure have some advantageous features. By forming CFETs with the upper FinFETs and the lower FinFETs having different fin numbers, the performance of the circuit adopting the CFETs may be tuned. For example, the write margin of the SRAM cells may be improved when the CFETs are used for forming the pull-up and pull-down transistors of the SRAM cells.

In accordance with some embodiments of the present disclosure, a method comprises forming a CFET comprising forming a first FinFET comprising forming at least one semiconductor fin having a first total count; and forming a first gate stack on the at least one semiconductor fin; and forming a second FinFET vertically aligned to the first FinFET, the forming the second FinFET comprising forming a plurality of semiconductor fins, wherein the plurality of semiconductor fins have a second total count greater than the first total count; and forming a second gate stack on the plurality of semiconductor fins. In an embodiment, the second FinFET overlaps the first FinFET, and wherein the forming the at least one semiconductor fin comprises performing a bottom fin-cut process to remove a fin in the at least one semiconductor fin.

In an embodiment, the at least one semiconductor fin is on a bulk portion of a semiconductor substrate, and wherein the method further comprises performing a backside thinning process to remove the bulk portion of the semiconductor substrate, wherein a bottom surface of the fin in the at least one semiconductor fin is exposed, and wherein the fin is etched in the bottom fin-cut process; and filling a dielectric material into a space left by the fin to form a dielectric fin. In an embodiment, the backside thinning process is stopped on a gate dielectric in the first gate stack. In an embodiment, in the bottom fin-cut process, a gate dielectric in the first gate stack is removed, and the dielectric fin physically contacts a gate electrode in the first gate stack.

In an embodiment, the dielectric fin is physically separated from a gate electrode in the first gate stack by a gate dielectric in the first gate stack. In an embodiment, the first FinFET overlaps the second FinFET, and wherein the forming the at least one semiconductor fin comprises a top fin-cut process. In an embodiment, the method further comprises forming shallow trench isolation regions, wherein the at least one semiconductor fin is in the shallow trench isolation regions; performing an etching process to remove a fin in the at least one semiconductor fin; and after the fin is removed, recessing the shallow trench isolation regions.

In an embodiment, a first one of the first FinFET and the second FinFET are formed in a first wafer, and the method further comprises bonding a second wafer to the first wafer, wherein the second wafer comprises a semiconductor layer; and forming a second one of the first FinFET and the second FinFET based on the semiconductor layer. In an embodiment, a first gate electrode in the first gate stack is electrically connected to a second gate electrode in the second gate stack. In an embodiment, the first gate electrode and the second gate electrode are formed as portions of a continuous homogeneous conductive region. In an embodiment, the first FinFET is separated from the second FinFET by a dielectric layer, and the method further comprises forming a gate via in the dielectric layer, wherein the second gate electrode is connected to the first gate electrode through the gate via.

In accordance with some embodiments of the present disclosure, a structure comprises a first FinFET comprising at least one semiconductor fin; and a first gate stack on the at least one semiconductor fin; and a second FinFET vertically aligned to the first FinFET, the forming the second FinFET comprising a plurality of semiconductor fins, wherein the plurality of semiconductor fins have a second total count greater than the first total count; and a second gate stack on the plurality of semiconductor fins. In an embodiment, the second FinFET overlaps the first FinFET, and wherein the first FinFET comprises a dielectric fin overlapped by a semiconductor fin in the plurality of semiconductor fins.

In an embodiment, the first gate stack comprises a gate dielectric, and a gate electrode on the gate dielectric, and wherein the dielectric fin physically contacts the gate electrode. In an embodiment, the first gate stack comprises a gate dielectric; and a gate electrode on the gate dielectric, wherein the dielectric fin is separated from the gate electrode by the gate dielectric. In an embodiment, the structure further comprises a dielectric layer underlying and overlapped by the at least one semiconductor fin and the dielectric fin, wherein the dielectric layer and the dielectric fin have a distinguishable interface in between.

In accordance with some embodiments of the present disclosure, a structure comprises a lower FinFET comprising at least one semiconductor fin; a dielectric fin; a first gate dielectric on the at least one semiconductor fin; and a first gate electrode on the first gate dielectric, wherein the first gate electrode comprises portions on opposite sides of the at least one semiconductor fin and the dielectric fin; and an upper FinFET comprising a plurality of semiconductor fins overlapping the at least one semiconductor fin; an additional semiconductor fin overlapping the dielectric fin; a second gate dielectric on the plurality of semiconductor fins; and a second gate electrode on the second gate dielectric, wherein the second gate electrode comprises portions on opposite sides of the plurality of semiconductor fins and the additional semiconductor fin. In an embodiment, in a cross-sectional view of the structure, the second gate dielectric comprises a plurality of discrete portions, each encircling one of the plurality of semiconductor fins, and the first gate dielectric is free from portions contacting the dielectric fin. In an embodiment, the dielectric fin has a same width as one of the at least one semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a complementary Field-Effect Transistor (CFET) comprising:
forming a first FinFET comprising:
forming at least one semiconductor fin having a first total count, wherein the forming the at least one semiconductor fin comprises performing a bottom fin-cut process to remove a fin in a first plurality of semiconductor fins and to leave the at least one semiconductor fin; and
forming a first gate stack on the at least one semiconductor fin; and
forming a second FinFET vertically aligned to and overlapping the first FinFET, the forming the second FinFET comprising:
forming a second plurality of semiconductor fins, wherein the second plurality of semiconductor fins have a second total count greater than the first total count; and
forming a second gate stack on the second plurality of semiconductor fins.

2. The method of claim 1, wherein the at least one semiconductor fin is on a bulk portion of a semiconductor substrate, and wherein the method further comprises:
performing a backside thinning process to remove the bulk portion of the semiconductor substrate, wherein a bottom surface of the fin in the at least one semiconductor fin is exposed, and wherein the fin is etched in the bottom fin-cut process; and
filling a dielectric material into a space left by the fin to form a dielectric fin.

3. The method of claim 2, wherein the backside thinning process is stopped on a gate dielectric in the first gate stack.

4. The method of claim 2, wherein in the bottom fin-cut process, a gate dielectric in the first gate stack is removed, and the dielectric fin physically contacts a gate electrode in the first gate stack.

5. The method of claim 2, wherein the dielectric fin is physically separated from a gate electrode in the first gate stack by a gate dielectric in the first gate stack.

6. The method of claim 2, wherein the dielectric fin comprises first opposing sidewalls vertically aligned to respective second sidewalls of one of the second plurality of semiconductor fins.

7. The method of claim 1, wherein a first one of the first FinFET and the second FinFET is formed in a first wafer, and the method further comprises:
bonding a second wafer to the first wafer, wherein the second wafer comprises a semiconductor layer; and
forming a second one of the first FinFET and the second FinFET based on the semiconductor layer.

8. The method of claim 1, wherein a first gate electrode in the first gate stack is electrically connected to a second gate electrode in the second gate stack.

9. The method of claim 8, wherein the first gate electrode and the second gate electrode are formed as portions of a continuous homogeneous conductive region.

10. The method of claim 9, wherein the first FinFET is separated from the second FinFET by a dielectric layer, and the method further comprises:
forming a gate via in the dielectric layer, wherein the second gate electrode is connected to the first gate electrode through the gate via.

11. The method of claim 1, wherein the first FinFET and the second FinFET are of opposite conductivity types.

12. The method of claim 1, wherein the bottom fin-cut process is performed from a backside of a respective wafer.

13. A structure comprising:
a first FinFET comprising:
at least one semiconductor fin having a first total count;
a dielectric fin; and
a first gate stack on the at least one semiconductor fin; and
a second FinFET vertically aligned to, and overlapping, the first FinFET, the second FinFET comprising:
a plurality of semiconductor fins, wherein the plurality of semiconductor fins have a second total count greater than the first total count, wherein the dielectric fin is overlapped by a semiconductor fin in the plurality of semiconductor fins; and a second gate stack on the plurality of semiconductor fins.

14. The structure of claim 13, wherein the first gate stack comprises a gate dielectric, and a gate electrode on the gate dielectric, and wherein the dielectric fin physically contacts the gate electrode.

15. The structure of claim 13, wherein the first gate stack comprises:

a gate dielectric; and a gate electrode on the gate dielectric, wherein the dielectric fin is separated from the gate electrode by the gate dielectric.

16. The structure of claim 13 further comprising a dielectric layer underlying and overlapped by the at least one semiconductor fin and the dielectric fin, wherein the dielectric layer and the dielectric fin have a distinguishable interface in between.

17. The structure of claim 13, wherein the dielectric fin comprises first opposing sidewalls vertically aligned to respective second sidewalls of one of the plurality of semiconductor fins.

18. A structure comprising:

a lower FinFET comprising:

at least one semiconductor fin;

a dielectric fin;

a first gate dielectric on the at least one semiconductor fin; and a first gate electrode on the first gate dielectric, wherein the first gate electrode comprises portions on opposite sides of the at least one semiconductor fin and the dielectric fin; and an upper FinFET comprising:

a plurality of semiconductor fins overlapping the at least one semiconductor fin;

an additional semiconductor fin overlapping the dielectric fin;

a second gate dielectric on the plurality of semiconductor fins; and a second gate electrode on the second gate dielectric, wherein the second gate electrode comprises portions on opposite sides of the plurality of semiconductor fins and the additional semiconductor fin.

19. The structure of claim 18, wherein in a cross-sectional view of the structure, the second gate dielectric comprises a plurality of discrete portions, each encircling one of the plurality of semiconductor fins, and the first gate dielectric is free from portions contacting the dielectric fin.

20. The structure of claim 18, wherein the dielectric fin has a same width as one of the at least one semiconductor fin.

* * * * *